US011832011B2

(12) United States Patent
Asakura

(10) Patent No.: US 11,832,011 B2
(45) Date of Patent: Nov. 28, 2023

(54) IMAGING DEVICE AND ELECTRONIC EQUIPMENT

(71) Applicant: Sony Semiconductor Solutions Corporation, Kanagawa (JP)

(72) Inventor: Luonghung Asakura, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 333 days.

(21) Appl. No.: 17/281,412

(22) PCT Filed: Sep. 13, 2019

(86) PCT No.: PCT/JP2019/036091
§ 371 (c)(1),
(2) Date: Mar. 30, 2021

(87) PCT Pub. No.: WO2020/095540
PCT Pub. Date: May 14, 2020

(65) Prior Publication Data
US 2022/0046201 A1 Feb. 10, 2022

(30) Foreign Application Priority Data
Nov. 7, 2018 (JP) .................................. 2018-209460

(51) Int. Cl.
*H04N 25/772* (2023.01)
*H01L 27/146* (2006.01)
*H04N 25/75* (2023.01)

(52) U.S. Cl.
CPC ..... *H04N 25/772* (2023.01); *H01L 27/14612* (2013.01); *H01L 27/14634* (2013.01); *H01L 27/14643* (2013.01); *H04N 25/75* (2023.01)

(58) Field of Classification Search
CPC ...... H04N 25/772; H04N 25/75; H04N 25/79; H01L 21/3205; H01L 21/768;
(Continued)

(56) References Cited

U.S. PATENT DOCUMENTS

| 7,085,408 B1* | 8/2006 | Chung-Chi Jim | H04N 25/00 382/312 |
|---|---|---|---|
| 7,592,827 B1 | 9/2009 | Brozek | |
| 8,575,955 B1 | 11/2013 | Brozek | |
| 9,264,703 B2* | 2/2016 | Pahr | G16Z 99/00 |

(Continued)

FOREIGN PATENT DOCUMENTS

| CN | 104040499 A | 9/2014 |
|---|---|---|
| CN | 205160709 U | 4/2016 |

(Continued)

OTHER PUBLICATIONS

International Search Report (PCT/ISA/210), International Application No. PCT/JP2019/036091, dated Nov. 26, 2019.

(Continued)

*Primary Examiner* — Kelly L Jerabek
(74) *Attorney, Agent, or Firm* — Michael Best & Friedrich LLP

(57) ABSTRACT

In one example, an imaging device includes stacked first and second substrates. The first substrate has an array of light receiving pixels divisible into pixel blocks and the second substrate has a pixel control portion that controls the pixels. The first substrate includes a first wiring line that transmits a first voltage, a second wiring line that transmits a second voltage, and a fault detection circuit that detects a wiring fault for each pixel block. The fault detection circuit detects a wiring fault by connecting wiring lines corresponding to pixel columns or pixel rows in series in each pixel block, connecting one of the ends of a wiring chain connected in series in each pixel block to the first wiring line, connecting the other end to the second wiring line, and detecting a wiring fault based on a potential at an intermediate position of the wiring chain.

8 Claims, 19 Drawing Sheets

(58) Field of Classification Search
CPC ............... H01L 23/522; H01L 27/1469; H01L 27/14612; H01L 27/14634; H01L 27/14643
See application file for complete search history.

(56) References Cited

U.S. PATENT DOCUMENTS

| | | | |
|---|---|---|---|
| 9,712,768 | B2 | 7/2017 | Tani |
| 2008/0136348 | A1 | 6/2008 | Varrin |
| 2014/0226027 | A1* | 8/2014 | Johansson .............. H04N 25/68 348/187 |
| 2016/0112700 | A1* | 4/2016 | Fei .......................... H04N 25/68 324/750.3 |

FOREIGN PATENT DOCUMENTS

| | | |
|---|---|---|
| JP | 2001-237377 A | 8/2001 |
| JP | 2006208137 A | 8/2006 |
| JP | 2006267576 A | 10/2006 |
| JP | 2007134573 A | 5/2007 |
| JP | 2010188009 A | 9/2010 |
| JP | 2012209360 A | 10/2012 |
| JP | 2015-23132 A | 2/2015 |
| JP | 2015-165544 A | 9/2015 |
| JP | 2017011368 A | 1/2017 |

OTHER PUBLICATIONS

Notification of Transmittal of the International Search Report and the Written Opinion of the International Searching Authority, or the Declaration (PCT/ISA/220), International Application No. PCT/JP2019/036091, dated Dec. 3, 2019.

Written Opinion of the International Search Authority (PCT/ISA/237), International Application No. PCT/JP2019/036091, dated Dec. 3, 2019.

* cited by examiner

Fig. 11A

| PAD | VOLTAGE APPLIED DURING SORTING | CONDITION | REMARKS |
|---|---|---|---|
| $V_a / V_b$ | SETTING a: $V_{DD1}$ / GND<br>SETTING b: GND / $V_{DD1}$ | $V_{DD1} >$ GND | (1) |
| test_en | $V_{DD2}$ | $V_{DD2} > V_{th}$ | (2) |
| $V_c$ | $V_{DD3}$ | $(V_{DD3}+V_{th}) > V_{DD1}/2$ | (3)_1 |
| | | $(V_{DD3}+V_{th}) < V_{DD1}$ | (3)_2 |
| $V_d$ | $V_{DD4}$ | $V_{DD4} > V_{DD3}$ | (4) |

Fig. 11B

| CASE | LOCATION OF OPEN CIRCUIT FAULT | SETTING a: $V_a=V_{DD1}$, $V_b=$GND | | SETTING b: $V_a=$GND, $V_b=V_{DD1}$ | |
|---|---|---|---|---|---|
| | | Vm POTENTIAL | LEAK BETWEEN Vc/Vd | Vm POTENTIAL | LEAK BETWEEN Vc/Vd |
| CASE (1) | NO OPEN CIRCUIT FAULT | $V_{DD1}/2$ | NO | $V_{DD1}/2$ | NO |
| CASE (2) | OPEN CIRCUIT FAULT OCCURRING ON LEFT SIDE OF vsl#j/2 | GND | NO | $V_{DD1}$ | YES |
| CASE (3) | OPEN CIRCUIT FAULT OCCURRING ON RIGHT SIDE OF vsl#j/2 | $V_{DD1}$ | YES | GND | NO |
| CASE (4) | OPEN CIRCUIT FAULTS OCCURRING ON BOTH LEFT AND RIGHT SIDES OF vsl#j/2 | UNDEFINED | UNDEFINED | UNDEFINED | UNDEFINED |

IMAGING DEVICE AND ELECTRONIC EQUIPMENT

TECHNICAL FIELD

The present disclosure relates to an imaging device and electronic equipment.

BACKGROUND ART

A light receiving chip is available that allows the inspection of the light receiving elements arranged in a matrix on a semiconductor substrate to be performed in a state before perforated electrodes for outputting light reception signals are formed (see PTL 1, for example).

In the light receiving chip described in PTL 1, a plurality of light receiving elements are divided into several element groups, and inspection pads are provided corresponding to the element groups. Each element group is connected to a common inspection signal line, and an output circuit and an input circuit are connected to each inspection pad. Using a changeover switch, each inspection signal line is connected to one of the output circuit and the input circuit of the corresponding inspection pad, allowing for the inspection of the light receiving element using the inspection pad.

CITATION LIST

Patent Literature

PTL 1

JP 2015-165544 A

SUMMARY

Technical Problem

The light receiving chip described in PTL 1 is intended for inspection of light receiving elements in a state before perforated electrodes for outputting light reception signals are formed.

It is an objective of the present disclosure to provide an imaging device in which the wiring formed for each pixel row or each pixel column can be inspected with minimum additional circuits, and electronic equipment including the imaging device.

Solution to Problem

An imaging device of the present disclosure for achieving the above objective includes:
a first substrate in which a pixel array portion composed of pixels that include light receiving portions and are arranged in a matrix is formed; and
a second substrate in which a pixel control portion that controls the pixels is formed and on which the first substrate is stacked, wherein
the first substrate includes
a first wiring line configured to transmit a first voltage,
a second wiring line configured to transmit a second voltage, and
a fault detection circuit configured to, when the pixel array portion is divided into a plurality of pixel blocks each corresponding to a plurality of pixel columns or a plurality of pixel rows, perform detection of a wiring fault for each pixel block, and the fault detection circuit is configured to
during time for detecting a wiring fault, connect a plurality of wiring lines corresponding to a plurality of pixel columns or a plurality of pixel rows in series in each pixel block, connect one of ends of a wiring chain connected in series in each pixel block to the first wiring line, connect the other end to the second wiring line, and
detect a wiring fault based on a potential at an intermediate position of the wiring chain.

Electronic equipment of the present disclosure for achieving the above objective has an imaging device having the above configuration.

BRIEF DESCRIPTION OF DRAWINGS

FIG. 11A is a diagram illustrating the settings and limitations of voltage values of the first voltage $V_a$/second voltage $V_b$/third voltage $V_c$/fourth voltage $V_d$ during the time for detecting an open circuit wiring fault, and FIG. 11B is a diagram illustrating the classification of cases that arise during time for detecting an open circuit wiring fault.

DESCRIPTION OF EMBODIMENTS

Figure 1:
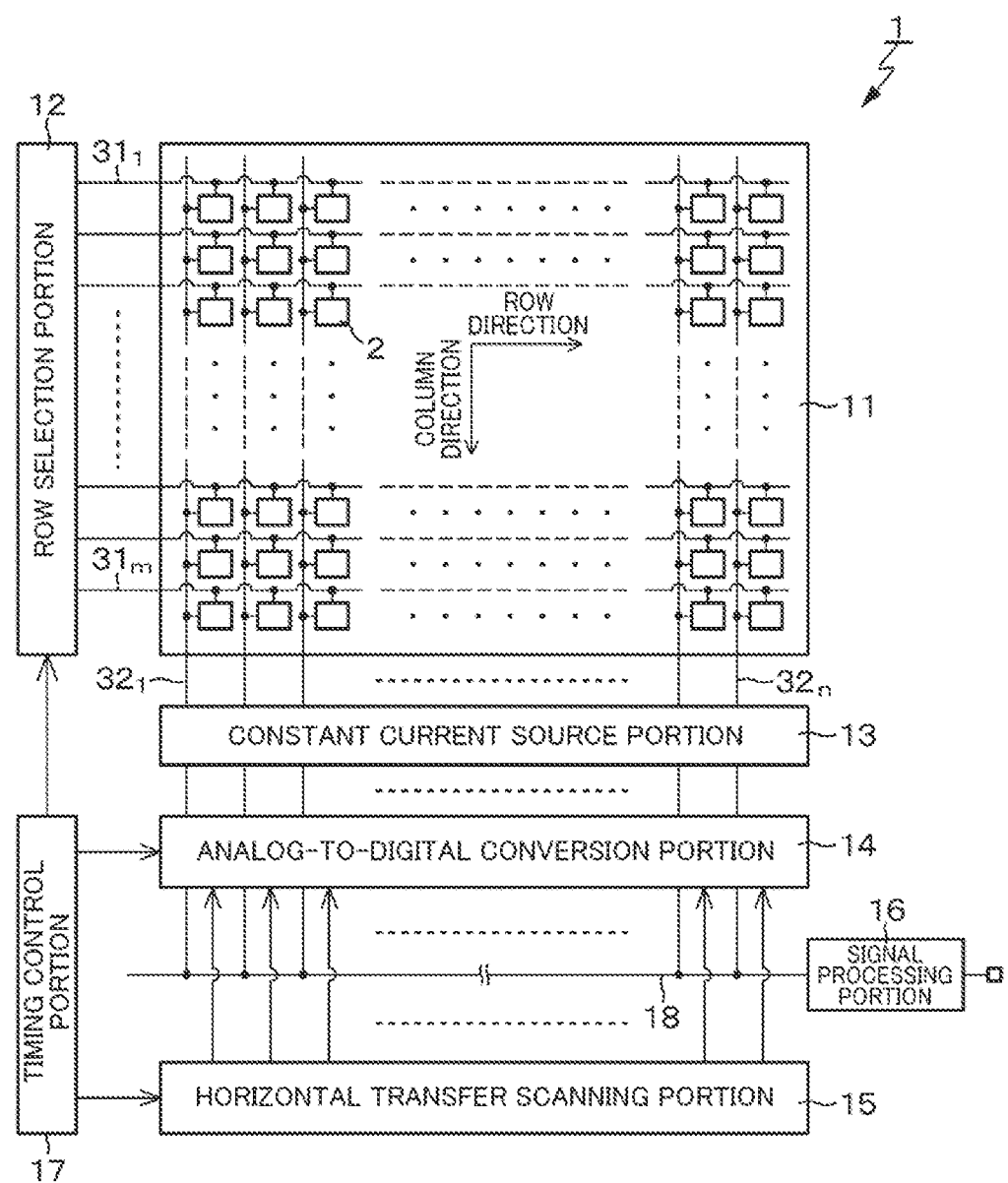
FIG. 1 is a block diagram schematically showing the basic configuration of a CMOS image sensor, which is an example of an imaging device of the present disclosure.

Hereinafter, embodiments for carrying out the technique of the present disclosure (hereinafter referred to as "embodiments") will be described in detail with reference to the drawings. The technique of the present disclosure is not limited to the embodiments. In the following description, the same reference numerals will be used for the same elements or elements having the same function, and overlapping portions are not described. The descriptions will be given in the following order.

1. General descriptions on imaging device and electronic equipment of present disclosure
2. Imaging device of present disclosure
2-1. Configuration example of CMOS image sensor
2-2. Pixel configuration example
2-3. Configuration example of analog-to-digital conversion portion
2-4. Stacked chip structure
2-5. Short/open circuit fault of wiring
3. Description of embodiment
3-1. Example 1 (Basic configuration example of pixel chip)
3-2. Example 2 (Specific configuration example of pixel chip according to Example 1)
4. Modification
5. Application example
6. Example of application of the technique according to the present disclosure
6-1. Electronic equipment of the present disclosure (example of imaging system)
6-2. Application example to endoscopic surgery system
6-3. Application example to moving object
7. Configuration in which the present disclosure can be embodied General Descriptions on Imaging Device and Electronic Equipment of Present Disclosure In the imaging device and the electronic equipment of the present disclosure, the fault detection circuit may be configured to include a switching element group that is configured to, during the time for detecting a wiring fault, form a wiring chain by connecting a plurality of wiring lines in series in each pixel block between the first wiring line and the second wiring line. It may be configured such that the switching element at one of the ends of the switching element group is connected to the first wiring line, and the switching element at the other end is connected to the second wiring line.

In the imaging device and the electronic equipment of the present disclosure including the above-described preferred configuration, the first substrate may be configured to have a third wiring line configured to transmit a third voltage and a fourth wiring line configured to transmit a fourth voltage. The fault detection circuit may be configured to include a first switching element that is connected to the intermediate position of the wiring chain and reads out a potential at the intermediate position, and a second switching element that is connected between the third wiring line and the fourth wiring line and performs an on/off operation according to the potential at the intermediate position read out through the first switching element.

Additionally, in the imaging device and the electronic equipment of the present disclosure including the above-described preferred configuration, the fault detection circuit may be configured to detect a wiring fault depending on whether a short current is generated between the third wiring line and the fourth wiring line. The fault detection circuit may be configured to detect a wiring break fault between one of the ends of the wiring chain and the intermediate position of the wiring chain, or a wiring break fault between the intermediate position of the wiring chain and the other end of the wiring chain.

Furthermore, in the imaging device and the electronic equipment of the present disclosure including the above-described preferred configuration, it may be configured such that the switching elements of the switching element group, the first switching element, and the second switching element of the fault detection circuit are composed of conductive type transistors that are identical to transistors composing the pixels. Specifically, it may be configured such that, when the transistors composing the pixels are composed of N-channel MOS transistors, the switching elements of the switching element group, the first switching element, and the second switching element of the fault detection circuit may be composed of N-channel MOS transistors of a same type as the pixels.

Imaging Device of Present Disclosure

The basic configuration of an imaging device to which the technique according to the present disclosure is applied (that is, the imaging device of the present disclosure) is now described. Here, a complementary metal oxide semiconductor (CMOS) image sensor, which is one type of XY-addressable imaging device, is described as an example of an imaging device. A CMOS image sensor is an image sensor manufactured by applying or partially using a CMOS process.

Configuration Example of CMOS Image Sensor

FIG. 1 is a block diagram schematically showing the basic configuration of a CMOS image sensor that is an example of an imaging device of the present disclosure.

A CMOS image sensor 1 of this example has a configuration including a pixel array portion 11 and a peripheral circuit portion of the pixel array portion 11. The pixel array portion 11 is formed by two-dimensionally arranging pixels 2, each including a light receiving portion (photoelectric conversion portion), in a row direction and a column direction, that is, in a matrix. Here, the row direction refers to the arrangement direction of the pixels 2 in a pixel row (so-called horizontal direction), and the column direction refers to the arrangement direction of the pixels 2 in a pixel column (so-called vertical direction). The pixels 2 perform photoelectric conversion to generate photoelectric charges according to the amount of received light and accumulate the charges.

The peripheral circuit portion of the pixel array portion 11 includes, for example, a row selection portion 12, a constant current source portion 13, an analog-to-digital conversion portion 14, a horizontal transfer scanning portion 15, a signal processing portion 16, and a timing control portion 17.

In the pixel array portion 11, pixel control lines $31_1$ to $31_m$ (hereinafter, may be collectively referred to as "pixel control lines 31") are arranged in the row direction for the respective pixel rows in the matrix pixel array. Additionally, vertical signal lines $32_1$ to $32_n$ (hereinafter, may be collectively referred to as "vertical signal lines 32") are arranged in the column direction for the respective pixel columns. The pixel control lines 31 transmit drive signals for driving when reading out signals from the pixels 2. FIG. 1 illustrates each pixel control line 31 as one line, but it is not limited to one line. One end of each pixel control line 31 is connected to one of the output ends of the row selection portion 12 for the respective rows.

The circuit portions of the peripheral circuit portion of the pixel array portion 11, that is, the row selection portion 12, the constant current source portion 13, the analog-to-digital conversion portion 14, the horizontal transfer scanning portion 15, the signal processing portion 16, and the timing control portion 17 are now described.

The row selection portion 12 is composed of a shift register, an address decoder, and the like, and controls the scanning of the pixel rows and the addresses of the pixel rows when selecting pixels 2 of the pixel array portion 11. Although the specific configuration is not shown, the row selection portion 12 generally has two scanning systems, a readout scanning system and a sweep scanning system.

To read out pixel signals from pixels 2, the readout scanning system selectively scans the pixels 2 in the pixel array portion 11 row by row in sequence. The pixel signals read out from the pixels 2 are analog signals. The sweep scanning system performs sweep scanning on the readout row on which readout scanning is to be performed by the readout scanning system, prior to the readout scanning by the time corresponding to the shutter speed.

The sweep scanning by the sweep scanning system sweeps out unnecessary charges from the photoelectric conversion portions of the pixels 2 in the readout row, thereby resetting the photoelectric conversion portions. Such sweeping (resetting) of unnecessary charges by the sweep scanning system achieves so-called electronic shutter operation. The electronic shutter operation refers to an operation of discarding the photoelectric charges in the photoelectric conversion portions and starting new exposure (starting to accumulate photoelectric charges).

The constant current source portion 13 includes a plurality of current sources 1, which may be MOS transistors and each connected to a corresponding one of the vertical signal lines $32_1$ to $32_n$ of the respective pixel columns, and supplies a bias current to each pixel 2 of the pixel rows that are selectively scanned by the row selection portion 12 through the vertical signal lines $32_1$ to $32_n$.

The analog-to-digital conversion portion 14 is composed of a set of a plurality of analog-to-digital converters provided corresponding to the pixel columns of the pixel array portion 11, for example, provided for the respective pixel columns. The analog-to-digital conversion portion 14 is a column-parallel analog-to-digital conversion portion that converts an analog pixel signal output through each of the vertical signal lines $32_1$ to $32_n$ of the respective pixel columns into an N-bit digital signal.

For example, as the analog-to-digital converter of the column-parallel analog-to-digital conversion portion 14, a single-slope analog-to-digital converter, which is an example of a reference signal comparison type analog-to-digital converter, can be used. However, the analog-to-digital converter is not limited to the single-slope analog-to-digital converter, and a sequential comparison type analog-to-digital converter, a delta-sigma modulation type ($\Delta\Sigma$ modulation type) analog-to-digital converter, or the like may be used.

The horizontal transfer scanning portion 15 is composed of a shift register, an address decoder, and the like, and controls the scanning of the pixel columns and the addresses of the pixel columns when reading out signals of the pixels 2 of the pixel array portion 11. Under the control of the horizontal transfer scanning portion 15, the pixel signals converted into digital signals by the analog-to-digital conversion portion 14 are read out through a horizontal transfer line 18 of 2N-bit width for each pixel column.

The signal processing portion 16 performs predetermined signal processing on the digital pixel signal fed through the horizontal transfer line 18 to generate two-dimensional image data. For example, the signal processing portion 16 corrects vertical line defects and point defects, clamps signals, and performs digital signal processing such as parallel-serial conversion, compression, coding, addition, averaging, and intermittent operation. The signal processing portion 16 outputs the generated image data as an output signal of the CMOS image sensor 1 to a device in the subsequent stage.

The timing control portion 17 generates various timing signals, clock signals, control signals, and the like, and based on these generated signals, controls the driving of the row selection portion 12, the constant current source portion 13, the analog-to-digital conversion portion 14, the horizontal transfer scanning portion 15, the signal processing portion 16, and the like.

Example of Pixel Circuit Configuration

Figure 2:
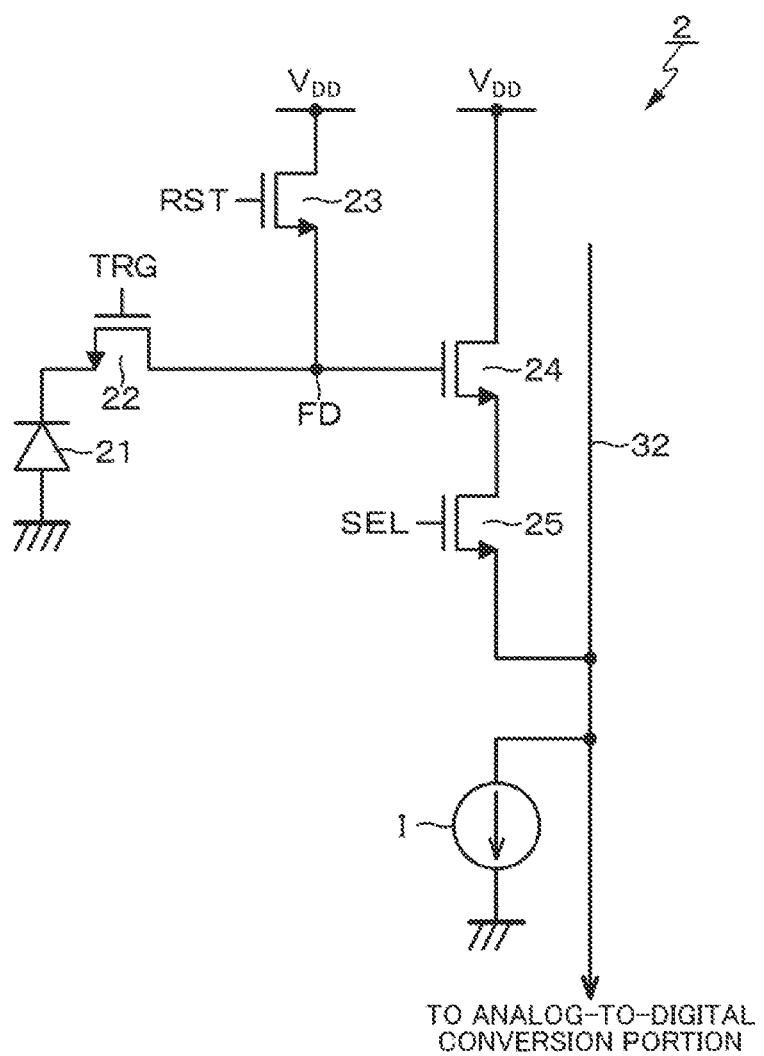
FIG. 2 is a circuit diagram showing an example of a pixel circuit configuration.

FIG. 2 is a circuit diagram showing an example of the circuit configuration of a pixel 2. The pixel 2 has a photodiode 21, for example, as a photoelectric conversion portion serving as a light receiving portion. The pixel 2 has a pixel configuration including a transfer transistor 22, a reset transistor 23, an amplification transistor 24, and a selection transistor 25 in addition to the photodiode 21.

As the four transistors of the transfer transistor 22, the reset transistor 23, the amplification transistor 24, and the selection transistor 25, N-channel MOS field effect transistors (FETs) may be used, for example. By configuring the pixel 2 with only N-channel transistors, it is possible to optimize in terms of area efficiency and process reduction. However, the combination of the conductive types of the four transistors 22 to 25 illustrated herein is only an example, and it is not limited to this combination.

A plurality of control lines, which are pixel control lines 31 described above, are provided for the pixels 2 such that the control lines are common to the pixels 2 of the respective pixel rows. These control lines are connected to the output ends of the row selection portion 12 corresponding to the respective pixel rows in a row-by-row manner. The row selection portion 12 outputs a transfer signal TRG, a reset signal RST, and a selection signal SEL to the plurality of control lines as required.

The anode electrode of the photodiode 21 is connected to a low-potential-side power supply (for example, ground), photoelectrically converts the received light into photoelectric charge (photoelectrons in this example) having a charge amount corresponding to the received light amount, and stores the photoelectric charge. The cathode electrode of the photodiode 21 is electrically connected to the gate electrode of the amplification transistor 24 via the transfer transistor 22. Here, the region in which the gate electrode of the amplification transistor 24 is electrically connected is a floating diffusion (floating diffusion region/impurity diffusion region) FD. The floating diffusion FD is a charge-voltage conversion portion that converts an electric charge into a voltage.

The gate electrode of the transfer transistor 22 receives from the row selection portion 12 a transfer signal TRG, which is active at a high level (for example, $V_{DD}$ level). The transfer transistor 22 becomes conductive in response to the transfer signal TRG and thus transfers the photoelectric charge that has been photoelectrically converted by the photodiode 21 and accumulated in the photodiode 21 to the floating diffusion FD.

The reset transistor 23 is connected between a node of the high-potential-side power supply voltage Von and the floating diffusion FD. The gate electrode of the reset transistor 23 receives from the row selection portion 12 a reset signal RST, which is active at a high level. The reset transistor 23 becomes conductive in response to the reset signal RST and resets the floating diffusion FD by discarding the charge of the floating diffusion FD to the node of the voltage $V_{DD}$.

In the amplification transistor 24, the gate electrode is connected to the floating diffusion FD, and the drain electrode is connected to a node of the high-potential-side power supply voltage $V_{DD}$. The amplification transistor 24 serves as an input portion of a source follower that reads out the signal obtained by the photoelectric conversion in the photodiode 21. That is, the source electrode of the amplification transistor 24 is connected to a vertical signal line 32 via the selection transistor 25. The amplification transistor 24 and the current source I connected to one end of the vertical signal line 32 form the source follower that converts the voltage of the floating diffusion FD into a potential of the vertical signal line 32.

In the selection transistor 25, the drain electrode is connected to the source electrode of the amplification transistor 24, and the source electrode is connected to the vertical signal line 32. The gate electrode of the selection transistor 25 receives from the row selection portion 12 a selection signal SEL, which is active at a high level. The selection transistor 25 becomes conductive in response to the selection signal SEL, thereby placing the pixel 2 in a selected state and transmitting the signal output from the amplification transistor 24 to the vertical signal line 32.

The selection transistor 25 may have a circuit configuration connected between the node of the high-potential-side power supply voltage Vim and the drain electrode of the amplification transistor 24. In this example, the pixel circuit of the pixel 2 has a 4Tr configuration including the transfer transistor 22, the reset transistor 23, the amplification transistor 24, and the selection transistor 25, that is, four transistors (Tr), but the configuration is not limited to this. For example, a 3Tr configuration may be formed by removing the selection transistor 25 and adding the function of tile selection transistor 25 to the amplification transistor 24, or a configuration of 5Tr or more may be formed by increasing the number of transistors as required.

Configuration Example of Analog-to-Digital Conversion Portion

Figure 3:
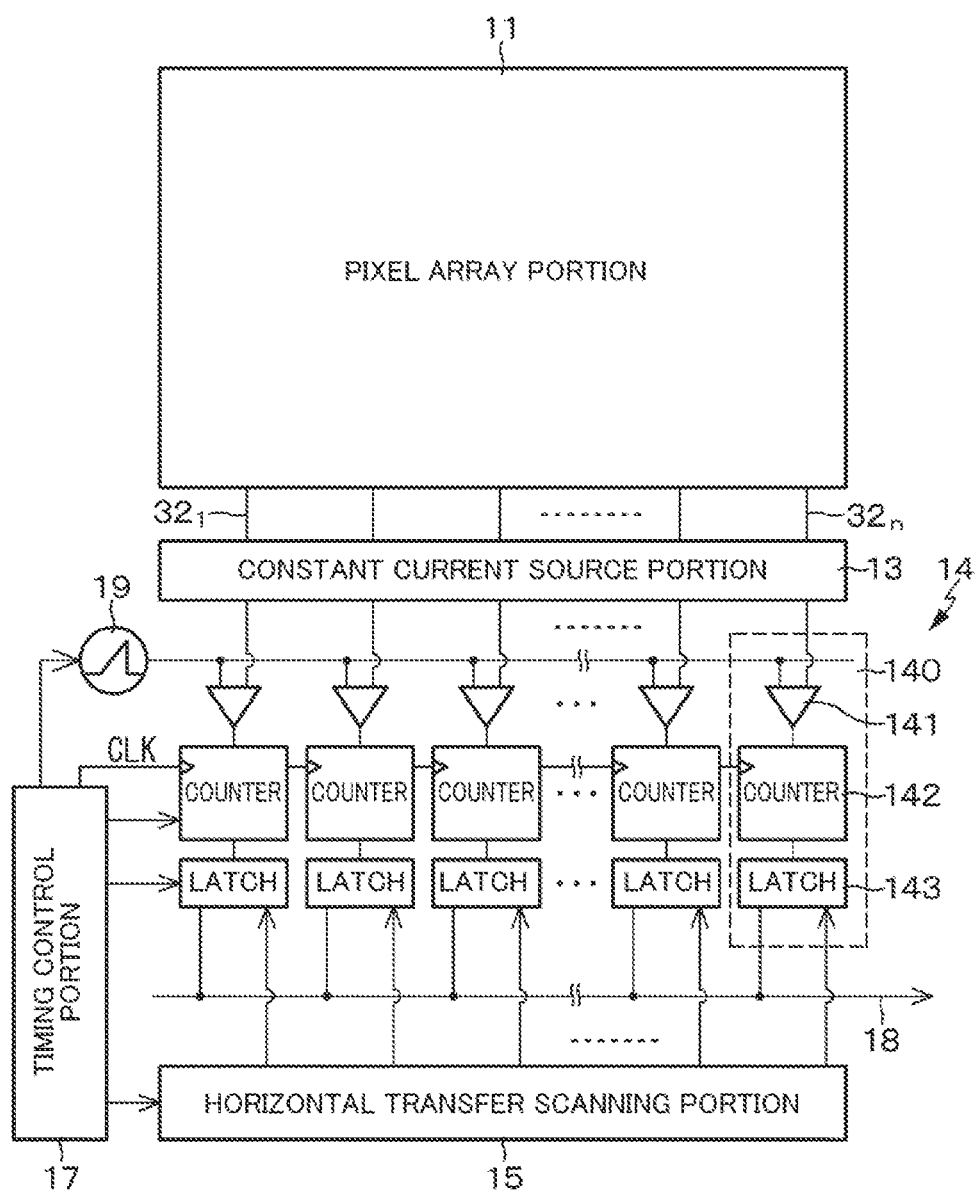
FIG. 3 is a block diagram showing an example of the configuration of a column-parallel analog-to-digital conversion portion mounted on the CMOS image sensor.

An example of the configuration of the column-parallel analog-to-digital conversion portion 14 is now described. FIG. 3 is a block diagram showing an example of the configuration of the column-parallel analog-to-digital conversion portion 14. The analog-to-digital conversion portion 14 in the CMOS image sensor 1 of the present disclosure is composed of a set of a plurality of single-slope analog-to-digital converters provided for the respective vertical signal lines 32₁ to 32ₙ. Here, the single-slope analog-to-digital converter 140 for the nth column is described as an example.

The single-slope analog-to-digital converter 140 has a circuit configuration including a comparator 141, a counter circuit 142, and a latch circuit 143. In the single-slope analog-to-digital converter 140, a reference signal of a so-called RAMP waveform (slope waveform) is used in which the voltage value changes linearly with time. The reference signal of ramp waveform is generated by a reference signal generation portion 19. The reference signal generation portion 19 can be configured using, for example, a digital-to-analog conversion (DAC) circuit.

The comparator 141 uses the analog pixel signal read from the pixel 2 as the comparison input, and the reference signal of ramp waveform generated by the reference signal generation portion 19 as the reference input, and compares the two signals. For example, the output of the comparator 141 is in a first state (e.g., high level) when the reference signal is greater than the pixel signal, and the output of the comparator 141 is in a second state (e.g., low level) when the reference signal is less than or equal to the pixel signal. Thus, the comparator 141 outputs a pulse signal having a pulse width corresponding to the signal level of the pixel signal, specifically, corresponding to the magnitude of the signal level, as the comparison result.

The counter circuit 142 receives a clock signal CLK from the timing control portion 17 at the same timing as the timing to start feeding the reference signal to the comparator 141. The counter circuit 142 measures the period of the pulse width of the output pulse of the comparator 141, that is, the period from the start of a comparison operation to the end of the comparison operation by performing a counting operation in synchronization with the clock signal CLK. The counting result (count value) of the counter circuit 142 is a digital value obtained by digitizing an analog pixel signal.

The latch circuit 143 holds (latches) the digital value that is the result of the counting by the counter circuit 142. The latch circuit 143 also performs correlated double sampling (CDS), which is an example of noise removal processing, by obtaining the difference between the count value in a D phase corresponding to the pixel signal in a signal level and the count value in a P phase corresponding to the pixel signal in a reset level. Then, under the driving of the horizontal transfer scanning portion 15, the latched digital value is output to the horizontal transfer line 18.

As described above, in the column-parallel analog-to-digital conversion portion 14 composed of a set of single-slope analog-to-digital converters 140, the digital value is obtained from the information on the time in which the amplitude relationship changes between the reference signal of analog value, which is generated by the reference signal generation portion 19 and changes linearly and the analog pixel signal output from the pixel 2. In the example described above, the analog-to-digital conversion portion 14 is composed of analog-to-digital converters 140 that are arranged in a one-to-one relationship with pixel columns. However, the analog-to-digital conversion portion 14 may be composed of analog-to-digital converters 140 each of which is provided corresponding to a plurality of pixel columns.

Stacked Chip Structure

The structure of the chip (semiconductor integrated circuit) of the CMOS image sensor 1 configured as described above is of a stacked chip structure (so-called stacked chip). The structure of the pixel 2 may be of a back-illuminated pixel structure that, when the substrate surface on which the wiring layer is formed is the front surface (front side), captures the light incident on the back side opposite to the front, side, or may be a front-illuminated pixel structure that captures the light incident on the front side.

Figure 4:
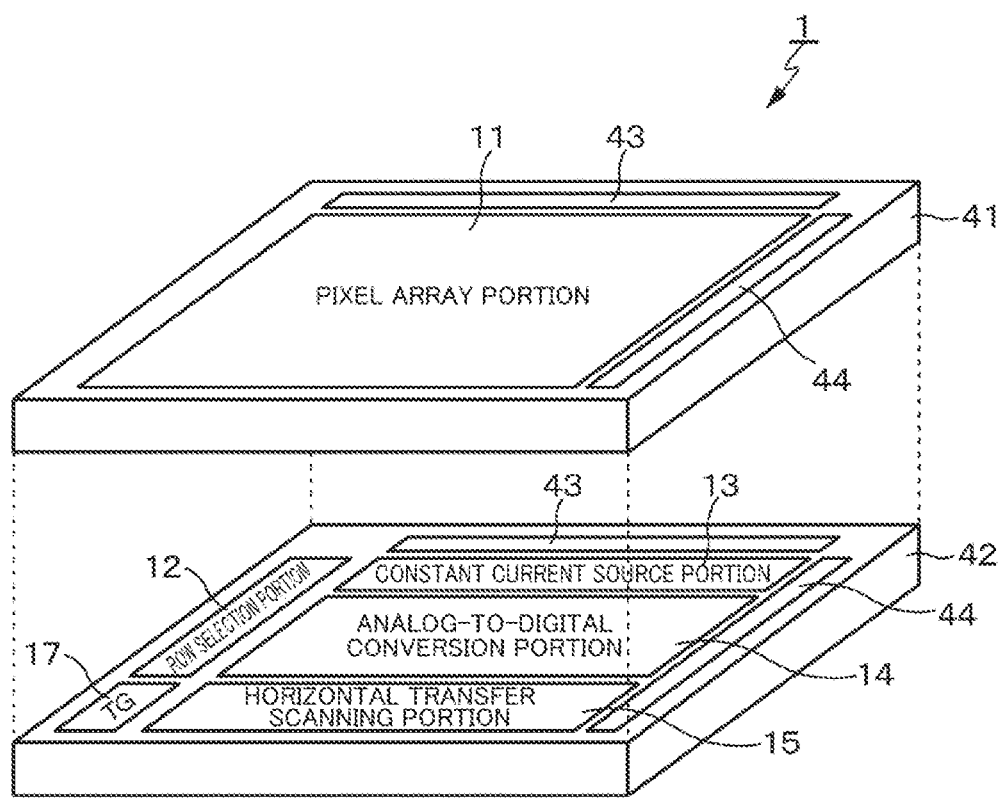
FIG. 4 is an exploded perspective view schematically showing a stacked chip structure.

FIG. 4 is an exploded perspective view schematically showing the stacked chip structure of the CMOS image sensor 1. As shown in FIG. 4, in the stacked chip structure, at least two semiconductor substrates of a pixel chip 41, which is a first substrate, and a logic chip 42, which is a second substrate, are stacked.

In this stacked structure, the pixels 2 of the pixel array portion 11, the pixel control lines $31_1$ to $31_m$ and the vertical signal lines $32_1$ to $32_n$ are formed on the pixel chip 41 of the first layer. On the logic chip 42 of the second layer, a pixel control portion for controlling pixels 2 is formed that includes the row selection portion 12, the constant current source portion 13, the analog-to-digital conversion portion 14, the horizontal transfer scanning portion 15, the signal processing portion 16, the timing control portion (TG) 17, the reference signal generation portion 19, and the like. The pixel control portion is the peripheral circuit portion of the pixel array portion 11. The pixel chip 41 of the first layer and the logic chip 42 of the second layer are electrically connected by connection portions 43 and 44, which may be via bumps, through-chip vias (TCVs), Cu—Cu hybrid bonding, or the like.

According to the CMOS image sensor 1 having this stacked structure, the pixel chip 41 of the first layer needs to be only large enough to have a size (area) that enables the pixel array portion 11 to be formed. This allows the size (area) of the pixel chip 41 and therefore the size of the entire chip to be reduced. Furthermore, a process suitable for producing the pixels 2 can be used for the pixel chip 41 of the first layer, and a process suitable for producing the pixel control portion (logic) can be used for the logic chip 42 of the second layer. As such, in manufacturing the CMOS image sensor 1, there is an advantage that the processes can be optimized. In particular, in manufacturing the pixel control portion on the logic chip 42, advanced fine processing can be used.

Here, a stacked structure of a two-layer structure in which the pixel chip 41 and the logic chip 42 are stacked is described as an example, but the stacked structure is not limited to the two-layer structure and may have three or more layers. When the stacked structure has three or more layers, the pixel control portion including the row selection portion 12, the constant current source portion 13, the analog-to-digital conversion portion 14, the horizontal transfer scanning portion 15, the signal processing portion 16, the timing control portion 17, the reference signal generation portion 19, and the like may be dispersed in the second and subsequent layers of the semiconductor substrates.

In the sorting of non-defective/defective products of the CMOS image sensor 1, the presence or absence of an open circuit (break) in the pixel control lines $31_1$ to $31_m$ and vertical signal lines $32_1$ to $32_n$, for example, and the presence or absence of a short (short circuit) between adjacent wiring lines are inspected. For a stacked chip (stacked chip structure) of a three-dimensional structure in which the pixel chip 41, on which the pixel array portion 11 is formed, and the logic chip 42, on which the pixel control portion is formed, are bonded together, the sorting of non-defective/defective products is generally performed in the inspection in a wafer state, which is the final shape formed after the pixel chip 41 and the logic chip 42 are bonded together.

Examples of a stacking method for stacked chips include a method that bonds wafers together (WOW: Wafer-on-Wafer) and a method that bonds a wafer and non-defective chips together (COW: Chip-on-Wafer). As for stacked chips of the COW method, unlike the stacked chips of the WOW method, the yield can be increased by selectively combining a non-defective product and a non-defective product.

Figure 5:
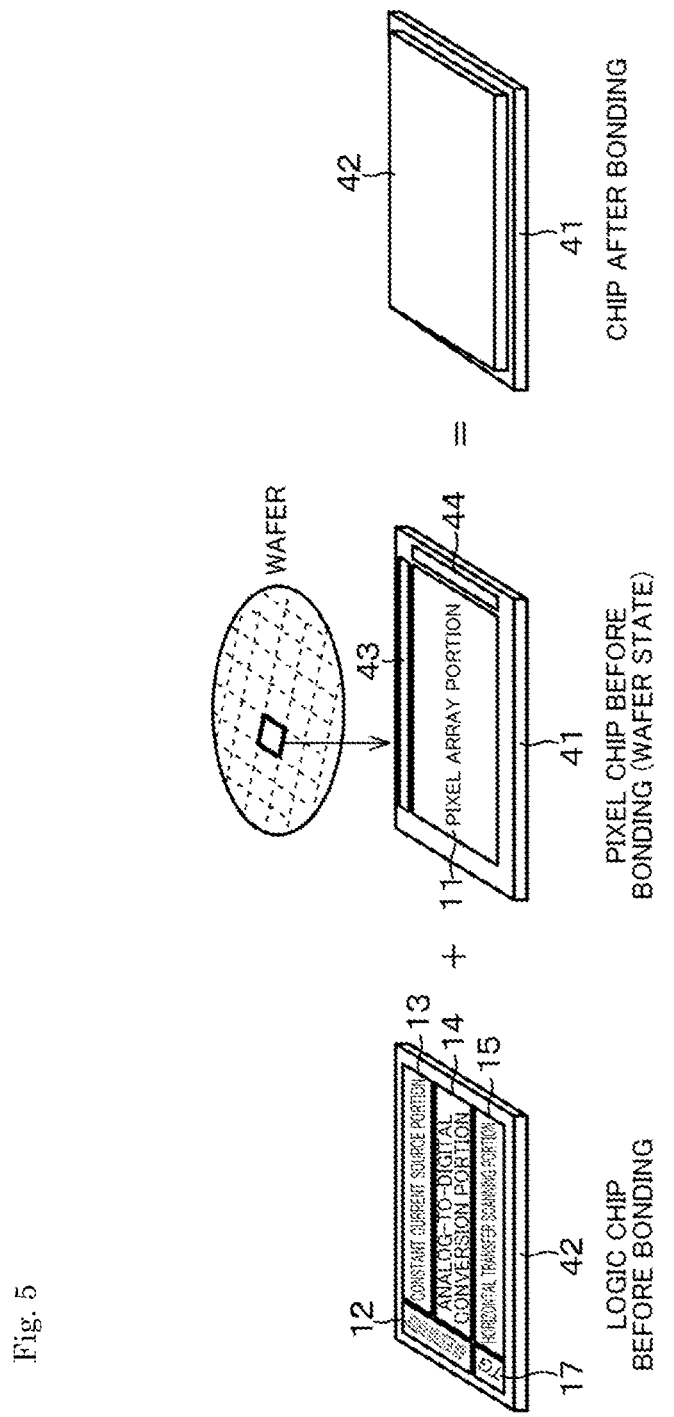
FIG. 5 is a schematic view showing a chip bonding procedure for a COW type stacked structure.

As shown in FIG. 5, as for the stacked structure of the COW method, pixel chips 41 on which pixel array portions 11 are mounted, and logic chips 42, on which pixel control portions (logic) such as row selection portions 12 and analog-to-digital conversion portions 14 are mounted, are first manufactured in separate wafer processes. Then, the logic chips 42 are diced, and the diced logic chips 42 are attached to the pixel chips 41 in a wafer state.

Figure 6:
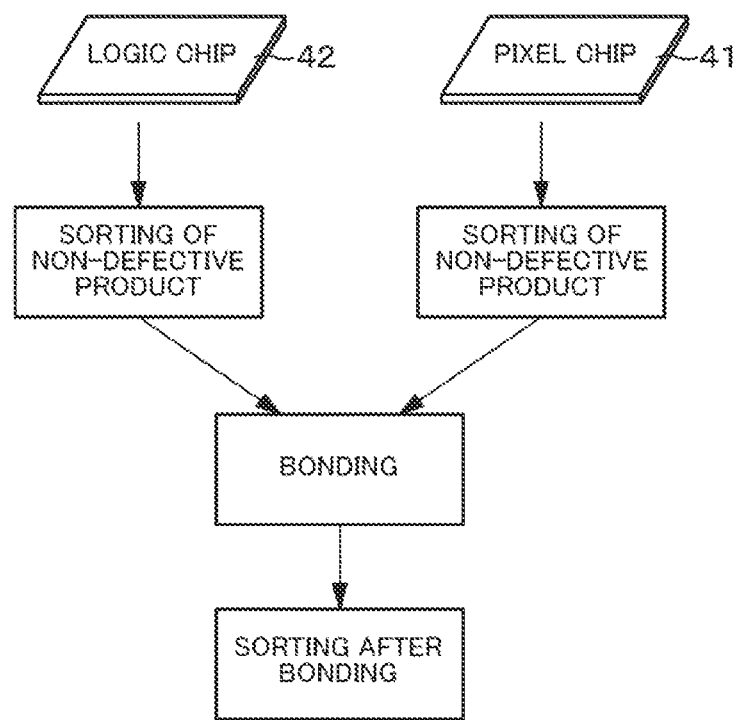
FIG. 6 is a process diagram showing a flow of a chip bonding process for a COW type stacked structure.

The first advantage of the stacked structure of the COW method is that each of the pixel chip 41 and the logic chip 42 can be manufactured in an optimized process. For example, for the pixel chips 41, a process optimized in terms of pixel characteristics such as white spot and maximum charge amount Qs can be used. For the logic chips 42, advanced fine processing can be used to increase the speed and to reduce power consumption. The second advantage is that, as shown in FIG. 6, each of the pixel chip 41 and the logic chip 42 is subjected to the sorting for non-defective products before bonding, and non-defective chips are bonded together. This prevents unnecessary yield loss, achieving a cost reduction. In particular, with large sensors with a large area, when the yield of the individual pixel/logic chips is not high, the sorting of non-defective/defective products achieves large cost reduction effects.

In order to enable the sorting of non-defective/defective products, it is essential to screen out defective products of individual pixel chips 41 and logic chips 42. In the process for the logic chips 42, low-voltage/high-voltage (thin film/thick film) CMOS transistors are usually available, so that the degree of freedom in designing the fault detection circuit is high. However, in the process for the pixel chips 41, it is generally likely that only N-channel MOS transistors of high voltage are usable.

Short/Open Circuit Fault of Wiring

As shown in FIG. 1, in the circuit configuration of the pixel array portion 11 mounted on the pixel chip 41, wiring lines are provided that include vertical signal lines $32_1$ to $32_n$ in the column direction and the pixel control lines $31_1$ to $31_m$ in the row direction. If short (short circuit)/open circuit (break) faults occur in these wiring lines, line defects occur in the output image of the imaging device. These wiring faults are the main cause of chip faults.

The detection of short circuit faults can be achieved relatively easily. For example, when different potentials are applied to adjacent wiring lines from the outside and a leak current is observed between the adjacent wiring lines, it can be determined that a short circuit has occurred somewhere.

Figure 7:
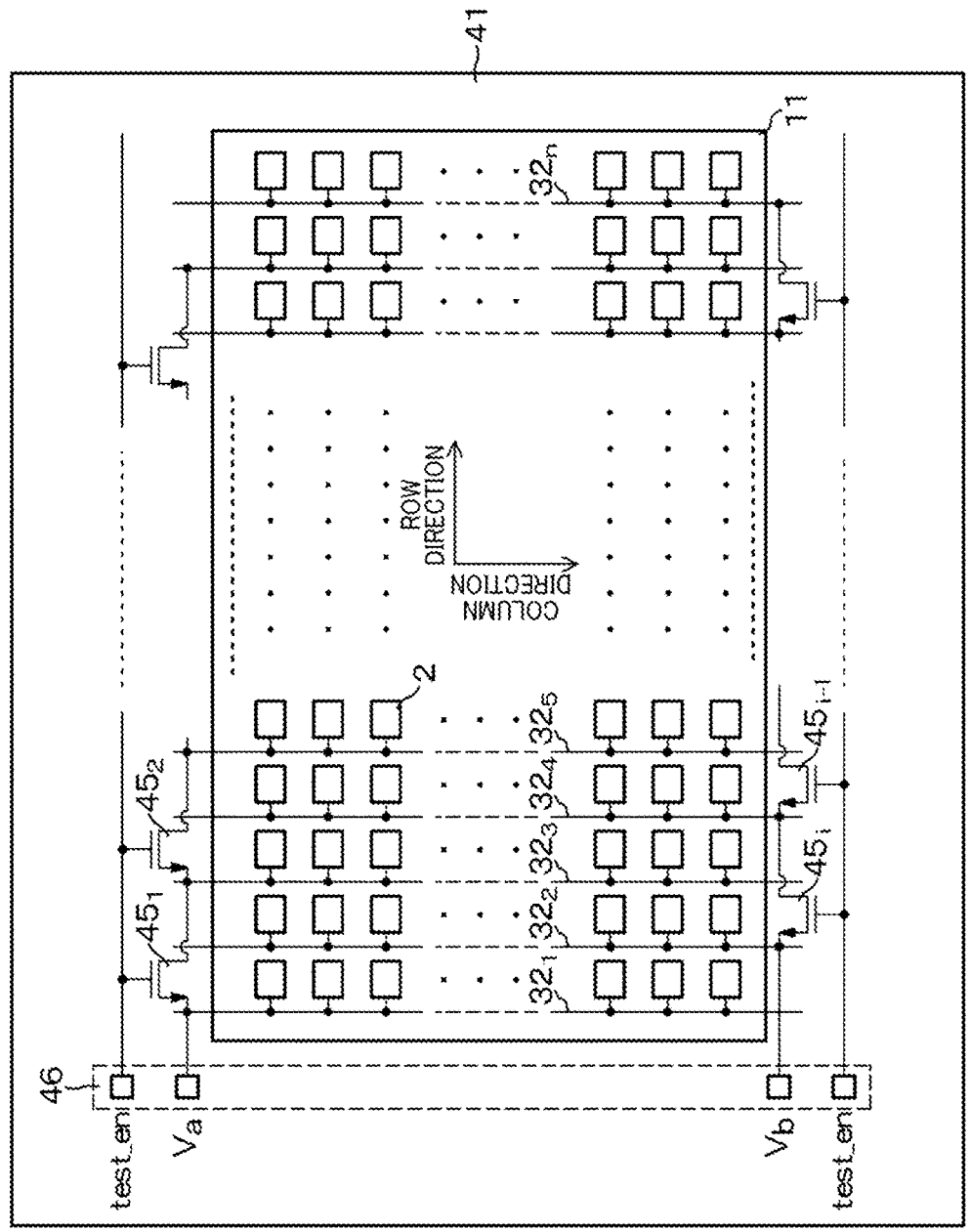
FIG. 7 is a diagram illustrating a method of detecting an open circuit wiring fault.

As shown in FIG. 7, to detect an open circuit wiring fault, a plurality of wiring lines (vertical signal lines $32_1$ to $32_n$ in this example) are connected in series by switching elements (e.g., MOS transistors) $45_1$ to $45_i$ to form one daisy chain (wiring chain). During the time for sorting non-defective/defective products, a test signal test_en is fixed to a high level, the switching elements $45_1$ to $45_i$ are switched to ON state, and voltages $V_a$ and $V_b$ are applied to both ends of the daisy chain. The test signal test_en and the voltages $V_a$ and $V_b$ are applied through a test pad 46.

When there are no open circuit wiring faults, a current corresponding to the ratio of the applied voltages $V_a$ and $V_b$ and the assumed resistance of the daisy chain flows through the daisy chain. When an open circuit fault occurs somewhere in the daisy chain, no current will flow through the daisy chain. An open circuit fault can be detected by determining whether the assumed current flows in the daisy chain. During normal use, the test signal test_en is fixed to a low level, and voltages $V_a$ and $V_b$ are not applied.

Although the concept of this method of detecting an open circuit fault is simple, there is a problem with its feasibility. Specifically, the pixel control lines $31_1$ to $31_m$ and the vertical signal lines $32_1$ to $32_n$ usually have a wiring resistance of about 10 kΩ per several lines, and, considering the current measurement accuracy (about nA), the number of wiring lines that can be connected in series in one daisy chain is limited to tens to hundreds of lines. With an imaging device having thousands to tens of thousands of wiring lines, a large number of daisy chains would be required, and it would be necessary to provide a power supply or a test pad for each daisy chain to independently detect faults. This is unrealistic.

Description of Embodiment

With recent imaging devices of stacked structure, the fault rate of the wiring of pixel control lines $31_1$ to $31_m$ and vertical signal lines $32_1$ to $32_n$ tends to be higher than the fault rate of individual pixels due to the large number of pixels and higher speed. As such, the embodiment of the present disclosure focuses on checking only the wiring layer of each pixel chip 41, in which the pixel array portion 11 is formed, and achieves the detection of wiring faults, specifically open circuit faults (breaks), in the pixel control lines $31_1$ to $31_m$ and the vertical signal lines $32_1$ to $32_n$ by adding minimum circuits.

Specifically all wiring lines of the pixel control lines $31_1$ to $31_m$ and the vertical signal lines $32_1$ to $32_n$ are divided into a plurality of daisy chains (wiring chains), and the detection (sorting) of open circuit faults is performed on all the divided daisy chains in parallel (simultaneously). As a result, the time required for detecting a wiring fault (that is, an open circuit fault) can be shortened. Additionally, the number of constituent elements (for example, transistors) and test terminals (test pads) of the circuits for detecting an open circuit fault can be reduced, thereby reducing the area overhead.

A specific example for sorting non-defective/defective products of the pixel chips 41 according to the embodiment of the present disclosure is now described.

Example 1

Figure 8:
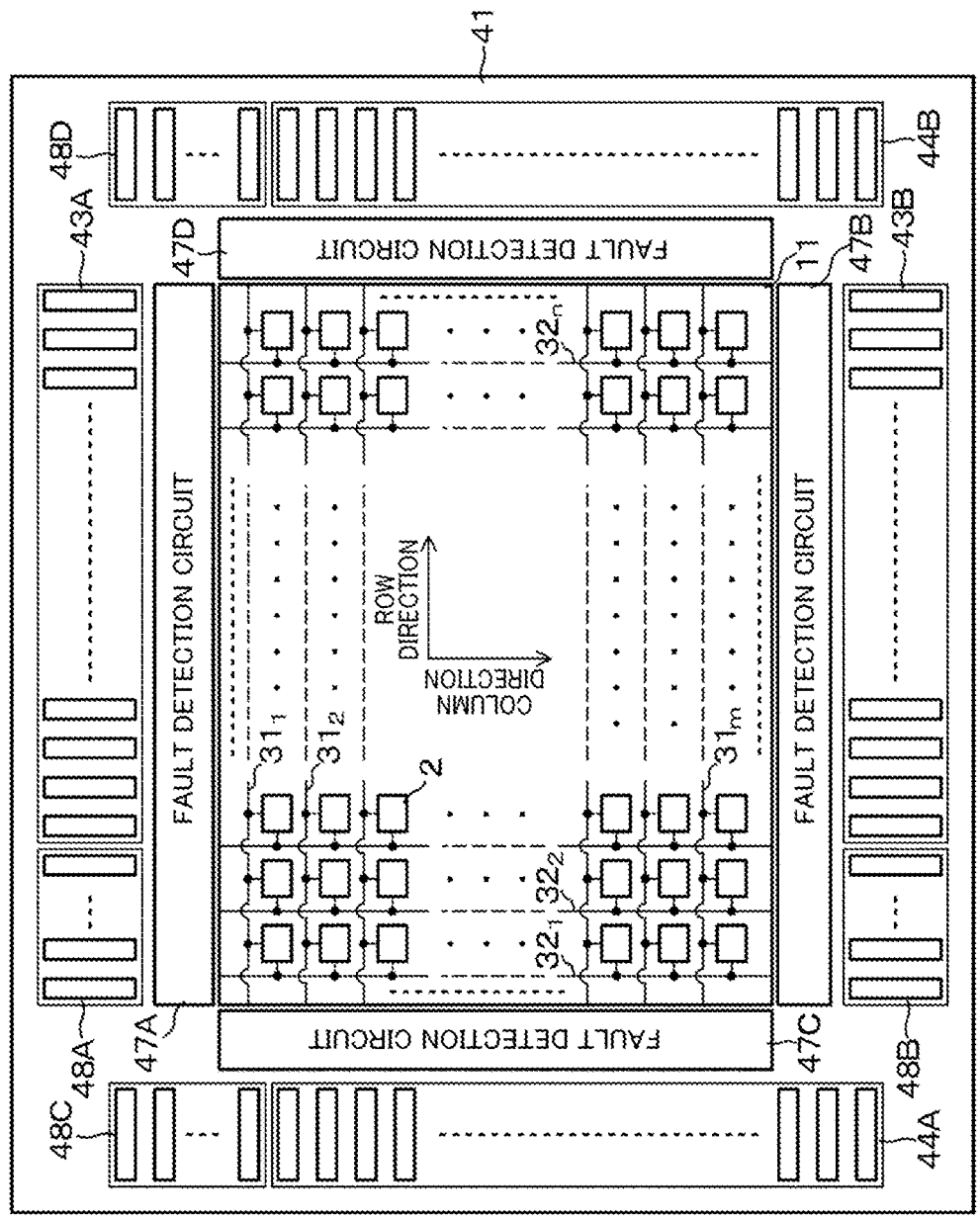
FIG. 8 is a schematic view showing an example of the basic configuration of a pixel chip according to Example 1.

Example 1 is a basic configuration example of a pixel chip 41 according to the embodiment of the present disclosure. FIG. 8 shows an example of the basic configuration of the pixel chip 41 according to Example 1.

The pixel chip 41 according to Example 1 has, in addition to the pixel array portion 11 in which the pixels 2 are two-dimensionally arranged in a matrix, fault detection circuits 47A to 47D for detecting (sorting) open circuit wiring faults, which are arranged on the upper, lower, left, and right sides of the pixel array portion 11. The fault detection circuits 47A and 47B arranged on the upper and lower sides of the pixel array portion 11 are used to detect wiring faults in the vertical signal lines $32_1$ to $32_n$ provided along the pixel columns. The fault detection circuits 47C and 47B arranged on the left and right sides of the pixel array portion 11 are used to detect wiring faults in the pixel control lines $31_1$ to $31_m$ provided along the pixel rows.

The pixel chip 41 is electrically connected to a logic chip 42 (see FIG. 5) via connection portions 43A and 43B and connection portions 44A and 44B arranged in its peripheral section. The connection portions 43A and 43B and the connection portions 44A and 44B are composed of bumps, TCVs, Cu—Cu hybrid bonding, and the like. The peripheral section of the pixel chip 41 also includes pad portions 48A to 48D for inspecting (sorting) non-defective/defective products corresponding to the respective fault detection circuits 47A to 47D.

Example 2

Figure 9:
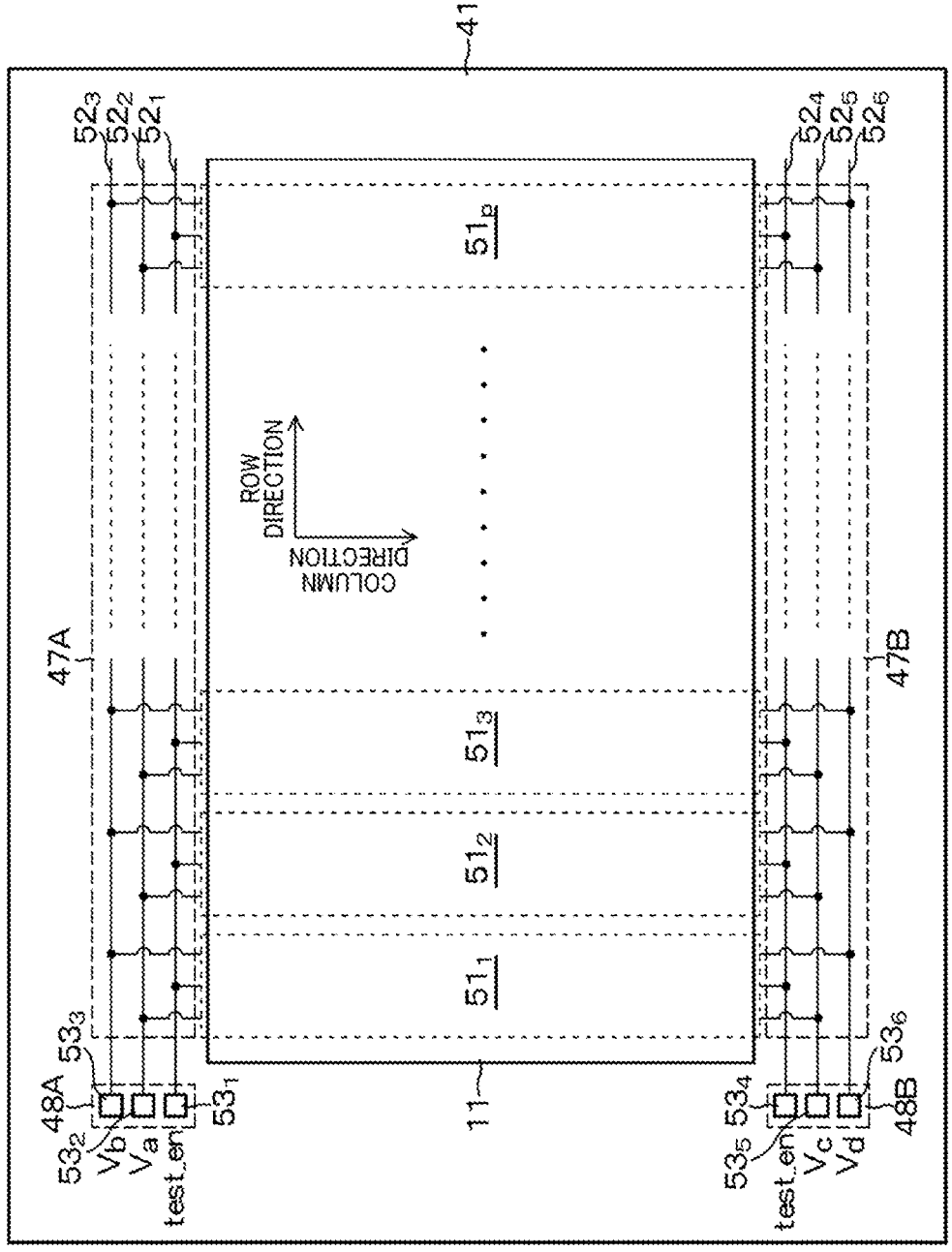
FIG. 9 is a circuit diagram showing an example of the specific configuration of a pixel chip according to Example 2.

Example 2 is a specific configuration example of the pixel chip 41 according to Example 1. FIG. 9 shows an example of a specific configuration of the pixel chip 41 according to Example 2.

In the following description, a case that detects an open circuit fault (break fault) in the vertical signal lines $32_1$ to $32_n$ provided along pixel columns is described as an example, but the same concept is applicable to the detection of an open circuit fault in the pixel control lines $31_1$ to $31_m$ provided along the pixel rows.

In the present example, the pixel array portion 11 is divided into a plurality of (p) regions in the row direction, and the divided regions are referred to as pixel blocks $51_1$ to $51_p$. For the vertical signal lines $32_1$ to $32_n$ provided along the pixel columns, one daisy chain is formed in each pixel block $51_1$ to $51_p$. The details will be described below.

The fault detection circuit 47A has three connection wiring lines $52_1$, $52_2$, and $52_3$ provided along the row direction. The pixel blocks $51_1$ to $51_p$ of the pixel array portion 11 are each connected to test pads $53_1$, $53_2$, and $53_3$ of the pad portion 48A through the three connection wiring lines $52_1$, $52_2$, and $52_3$.

A test signal test_en is given to the test pad $53_1$, and the connection wiring line $52_1$ transmits the test signal test_en in the row direction. A first voltage $V_a$ is applied to the test pad $53_2$, and the connection wiring line $52_2$, which is a first wiring line, transmits this first voltage $V_a$ in the row direction. A second voltage $V_b$ is applied to the test pad $53_3$, and the connection wiring line $52_3$, which is a second wiring line, transmits this second voltage $V_b$ in the row direction.

The fault detection circuit 47B has three connection wiring lines $52_4$, $52_5$, and $52_6$ that are provided along the row direction. The pixel blocks $51_1$ to $51_p$ of the pixel array portion 11 are each connected to the test pads $53_4$, $53_5$, and $53_6$ of the pad portion 48B through the three connection wiring lines $52_4$, $52_5$, and $52_6$.

A test signal test_en is given to the test pad $53_4$, and the connection wiring line $52_4$ transmits this test signal test_en in the row direction. A third voltage $V_c$ is applied to the test pad $53_5$, and the connection wiring line $52_5$, which is a third wiring line, transmits this third voltage $V_c$ in the row direction. A fourth voltage $V_d$ is applied to the test pad $53_6$, and the connection wiring line $52_6$, which is a fourth wiring line, transmits this fourth voltage $V_d$ in the row direction.

Figure 10:
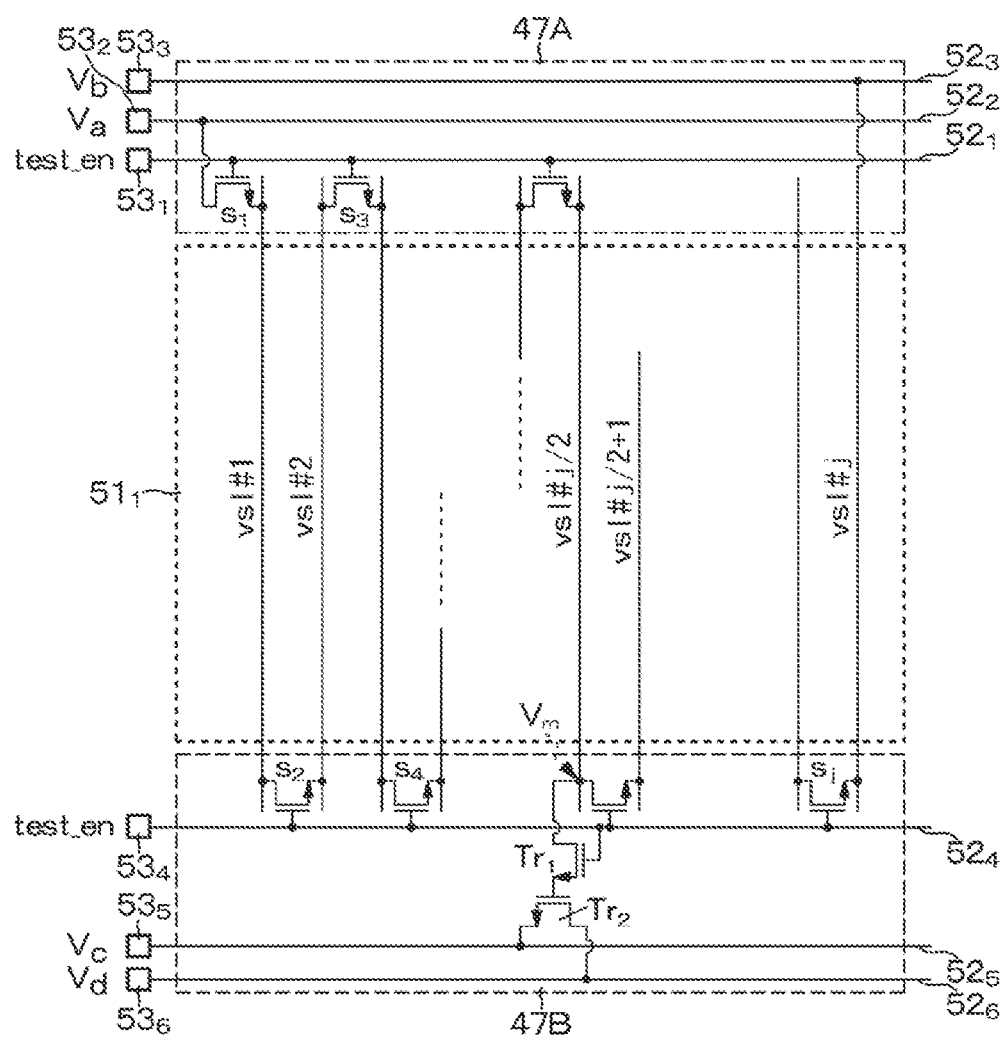
FIG. 10 is a circuit diagram showing an example of a daisy chain of one pixel block of a pixel array portion and the circuit configuration of two fault detection circuits.

FIG. 10 shows an example of a circuit configuration of a daisy chain of one pixel block of the pixel array portion 11 and two fault detection circuits 47A and 47B. Here, the pixel block $51_1$ is described as an example, but the other pixel blocks $51_2$ to $51_p$ have the same configuration. In FIG. 10, for convenience of description, j vertical signal lines $32_1$ to $32_j$ of the pixel block $51_1$ are indicated as vsl #1 to vsl #j.

The j vertical signal lines vsl #1 to vsl #j of the pixel block $51_1$ are connected in series by a switching element group at each end to form one daisy chain. In the following description, the switching elements (for example, MOS transistors) of the switching element group are referred to as switching transistors $s_1$ to $s_j$. The gate electrodes (gate terminals) of the switching transistors $s_1$ to $s_j$ are connected to the test pads $53_1$ and $53_4$ via the connection wiring lines $52_1$ and $52_4$. During the time for detecting an open circuit fault, a high-level test signal test_en is given through the test pads $53_1$ and $53_4$ and the connection wiring lines $52_1$ and $52_4$, so that they are switched to ON state and form a daisy chain.

The first voltage $V_a$ is applied to the switching transistor $s_1$ corresponding to the first vertical signal line vsl #1 through the connection wiring line $52_2$, and the second voltage $V_b$ is applied to the switching transistor $s_j$ corresponding to the jth vertical signal line vsl #j through the connection wiring line $52_3$. Applying the high-level test signal test_en, the first voltage $V_a$, and the second voltage $V_b$ enables the detection (sorting) of open circuit faults in the vertical signal lines vsl #1 to vsl #j.

In addition to the connection wiring lines $52_4$, $52_5$, and $52_6$ and the switching transistors $s_2$, $s_4$, . . . , $s_j$, the fault detection circuit 47B includes a switching transistor $Tr_1$, which is a first switching element, and a switching transistor $Tr_2$, which is a second switching element, in the switching transistor $Tr_1$, the gate electrode is connected to the test pad $53_4$ via the connection wiring line $52_4$, and the drain electrode is connected to an intermediate position $V_m$ of the daisy chain. In the switching transistor $Tr_2$, the source electrode is connected to the test pad $53_5$ via the connection wiring line $52_5$, the drain electrode is connected to the test pad $53_6$ via the connection wiring line $52_6$, and the gate electrode is connected to the source electrode of the switching transistor $Tr_1$.

The switching transistors $s_1$ to $s_j$ of the fault detection circuits 47A and 47B and the switching transistors $Tr_1$ and $Tr_2$ of the fault detection circuit 47B may be configured to be the same conductive type transistors as the transistors composing the pixels 2. Specifically, as for the stacked structure shown in FIG. 4, the pixels 2 on the pixel chip 41 are composed only of N-channel MOS transistors as shown in FIG. 2 to achieve optimization in terms of area efficiency and process reductions. Accordingly, the switching transistors $s_1$ to $s_j$ and the switching transistors $Tr_1$ and $Tr_2$ are preferably composed of N-channel MOS transistors of the same type as the pixels 2. This eliminates the need to add a new element type (that is, add a new process) to the existing pixel process.

In the fault detection circuits 47A and 47B having the above configuration, during the time for detecting an open circuit fault (during the time for sorting non-defective/defective products), a high-level test signal test_en is applied to the test, pads $53_1$ and $53_4$, and the predetermined voltage values are applied as the first voltage $V_a$/second voltage $V_b$/third voltage $V_c$/fourth voltage $V_d$. Then, in this state, by monitoring the presence or absence of a short current between the test pads $53_5$ and $53_6$, it is possible to determine whether an open circuit fault (break fault) occurs in the vertical signal lines $32_1$ to $32_n$ in the respective pixel blocks.

FIG. 11A shows the settings and limitations of the voltage values of the first voltage $V_a$/second voltage $V_b$/third voltage $V_c$/fourth voltage $V_d$ during the time for detecting an open circuit fault (during the time for sorting non-defective/defective products). In the table of FIG. 11A, $V_{th}$ is the threshold voltage of the switching transistors $s_1$ to $s_j$ and the switching transistors $Tr_1$ and $Tr_2$.

Specifically regarding the settings and limitations of the first voltage $V_a$/second voltage $V_b$/third voltage $V_c$/fourth voltage $V_d$ during the time for detecting an open circuit fault, one of the first voltage $V_a$ and the second voltage $V_a$ is set to a ground level GND, which is a reference potential, for example, and the other is set to a voltage value $V_{DD1}$. In Setting a, the first voltage $V_a$ is set to the ground level GND, and the second voltage $V_b$ is set to the voltage value $V_{DD1}$. In Setting b, the first voltage $V_a$ is set to the voltage value $V_{DD1}$, and the second voltage $V_b$ is set to the ground level GND.

Also, the test signal test_en and the third voltage $V_c$/fourth voltage $V_d$ are set to voltage value $V_{DD2}$/voltage value $V_{DD3}$/voltage value $V_{DD4}$. The voltage values of the test signal test_en and the third voltage $V_c$/fourth voltage $V_d$ are common to Settings a and b. FIG. 11A shows the relationship between the voltage value $V_{DD1}$/voltage value $V_{DD2}$/voltage value $V_{DD3}$/voltage value $V_{DD4}$. According to Condition (2), the switching transistors $S_1$ to $s_j$ and the switching transistors $Tr_1$ and $Tr_2$ are switched to ON state, and the vertical signal lines vsl #1 to vsl #j are electrically connected in series with one another to form one daisy chain.

FIG. 11B shows the classification of cases that arise during the time for detecting an open circuit fault. As the common setting during the time for detecting an open circuit fault, the third voltage $V_c$ is set to a voltage value $V_{DD3}$ higher than the voltage value $V_{DD1}/2+V_{th}$, and the fourth voltage $V_d$ is set to a voltage value $V_{DD4}$ higher than the voltage value $V_{DD3}$ ($V_{DD3}<V_{DD4}$).

Case (1)

Case (1) is a case in which an open circuit fault does not occur in the vertical signal lines vsl #1 to vsl #j in the daisy chain. In case (1), the potential at the intermediate position of the daisy chain becomes ½ of the voltage value $V_{DD1}$. The potential at the intermediate position $V_m$ is input to the gate electrode of the switching transistor $Tr_2$ via the switching transistor $Tr_1$. According to Condition (3)_1 in the table of FIG. 11A, the switching transistor $Tr_2$ is switched to OFF state because the gate voltage is lower than the source/drain voltage. As such, in Case (1), a short current is not generated between the test pads $53_5$ and $53_6$.

Case (2)

Case (2) is a case in which an open circuit fault occurs in the vertical signal lines vsl #1 to vsl #j/2 between one end of the daisy chain and the intermediate position $V_m$, and an open circuit fault does not occur in the vertical signal lines vsl #(j/2+1) to vsl #j. In this case, the potential at the intermediate position $V_m$ of the daisy chain is pulled to the potential of $V_b$. That is, in Setting a, the potential at the intermediate position $V_m$ becomes the ground level GND, and in Setting b, the potential at the intermediate position $V_m$ becomes $V_{DD1}$. Then, the switching transistor $Tr_2$ in Setting b is switched to ON state according to Condition (3)_2 in the table of FIG. 11A. As a result, a short path is formed between the test pads $53_5$ and $53_6$ through the connection wiring lines $52_5$ and $52_6$, and a short current is generated. In Setting a, the switching transistor $Tr_2$ is switched to OFF state, so that a short current is not generated between the test pads $53_5$ and $53_6$.

Case (3)

Case (3) is a case in which an open circuit fault does not occur in the vertical signal lines vsl #1 to vsl #j/2 between the intermediate position $V_m$ and the other end of the daisy chain, and an open circuit fault occurs in the vertical signal lines vsl #(j/2+1) to vsl #j. In this case, the potential at the intermediate position $V_m$ of the daisy chain is pulled to the potential of $V_a$. That is, in Setting b, the potential at the intermediate position $V_m$ becomes $V_{DD1}$, and in Setting a, the potential at the intermediate position $V_m$ becomes the ground level GND. As a result, the switching transistor $Tr_2$ is switched to ON state in Setting b, a short path is formed between the test pads $53_5$ and $53_6$ through the connection wiring lines $52_5$ and $52_6$, and a short current is generated. In Setting a, the switching transistor $Tr_2$ is switched to OFF state, so that a short current is not generated between the test pads $53_5$ and $53_6$.

Case (4)

Case (4) is a case in which an open circuit wiring fault occurs in both the vertical signal lines vsl #1 to vsl #j/2 and the vertical signal lines vsl #(j/2+1) to vsl #j. In this case, the potential at the intermediate position $V_m$ of the daisy chain in Settings a and b becomes undefined. If the switching transistor $Tr_2$ is accidentally switched to ON state in either Settings a and b, a failure in detecting the open circuit faults can occur.

However, even if there is a failure in detecting an open circuit fault in the sorting of the individual pixel chip 41, the fault can be screened out as a line defect in the sorting using an image after the pixel chip 41 and the logic chip 42 are bonded together, thereby avoiding an outflow of defective chips. Since Case (4) has a lower probability of occurrence than Cases (2) and (3), the worsening in terms of the yield and sorting time of the bonded chips due to the failure in sorting of individual pixel chips 41 has a small impact on the cost.

In the above, the use cases of the daisy chain of one pixel block $51_1$ that may occur during sorting are described, but the actual sorting is simultaneously performed on all of the pixel blocks $51_1$ to $51_p$. If a short current is not generated between the test pads $53_5$ and $53_6$ in Setting a and Setting b, there is a possibility that the detection of an open circuit fault may be failed in Case (4), but it can be considered that an open circuit fault is highly unlikely and bonding may be performed. On the contrary if a short current is generated between the test pads $53_5$ and $53_6$ in either Setting a or Setting b, it is certain that an open circuit fault has occurred in some daisy chain.

It is more advantageous to divide the vertical signal lines $32_1$ to $32_n$ into a plurality of daisy chains than to combine them into one large daisy chain. This is due to the following reason. That is, the larger the number of lines connected in series in a daisy chain, the higher the resistance value of the daisy chain, if a weak leak current that does not cause a chip fault occurs in a transistor connected to the vertical signal lines $32_1$ to $32_n$ or the pixel control lines $31_1$ to $31_m$, the voltage at the intermediate position $V_m$ of the daisy chain that is originally expected can be changed, hindering appropriate sorting. For the stability of sorting, it is practical to divide into chains such that the resistance value of one daisy chain is several hundred kΩ to several MΩ.

Specifically the above-mentioned weak leak current may be a gate leakage of a transistor connected to the pixel control lines $31_1$ to $31_m$, or a source drain leakage of a selection transistor connected to the vertical signal lines $32_1$ to $32_n$ (selection transistor 25 of FIG. 2).

As in Conditions (2)/(3) of applied voltages shown in FIG. 11A, it is necessary to consider the threshold voltage of the NT-channel MOS transistors for the voltages applied during sorting. If the variations in threshold voltages of the N-channel MOS transistors are large, the voltages may fail to be within the limitations, adversely affecting the sorting accuracy. When there are large variations in the threshold voltages among lots/wafers/chips, the threshold voltages of the pixel transistors may be obtained in advance using a known technique, and this information may be used to dynamically adjust the voltages applied during sorting. This limits the influence of the variations and improves the robustness of the sorting.

It is necessary to ensure that the circuits that are newly added for sorting do not interfere with or adversely affect the normal operation of the CMOS image sensor. As an example of a method to achieve this, during normal operation, the switching transistors $s_1$ to $s_j$ and the switching transistors $Tr_1$ and $Tr_2$ remain in OFF state, so that the daisy chain is not formed. Specifically by controlling the test signal test_en from the outside of the sensor so that test signal test_en becomes the ground level (or a voltage lower than the threshold voltage or by providing a resistor in the chip, it is possible to place the switching transistors $s_1$ to $s_j$ and the switching transistors $Tr_1$ and $Tr_2$ in OFF state during normal operation. The same process may be performed for each voltage value of the first voltage $V_a$/second voltage $V_b$/third voltage $V_c$/fourth voltage $V_d$, if necessary.

Figure 12:
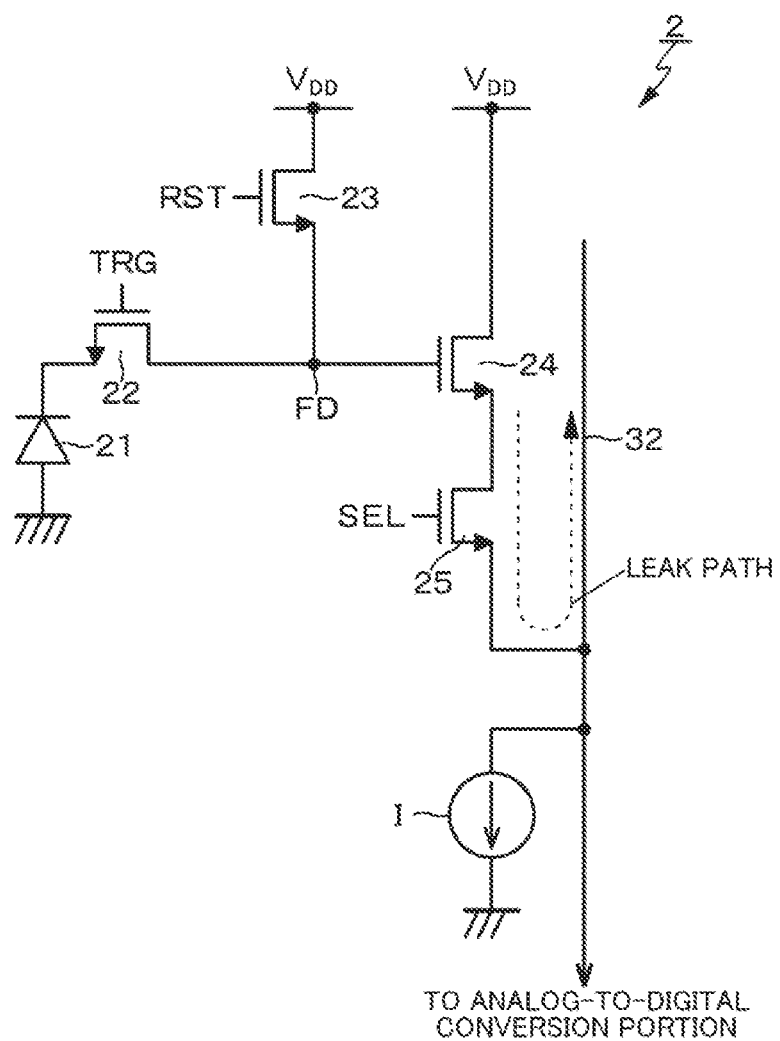
FIG. 12 is a diagram illustrating a leak current generated during break inspection.
Figure 13:
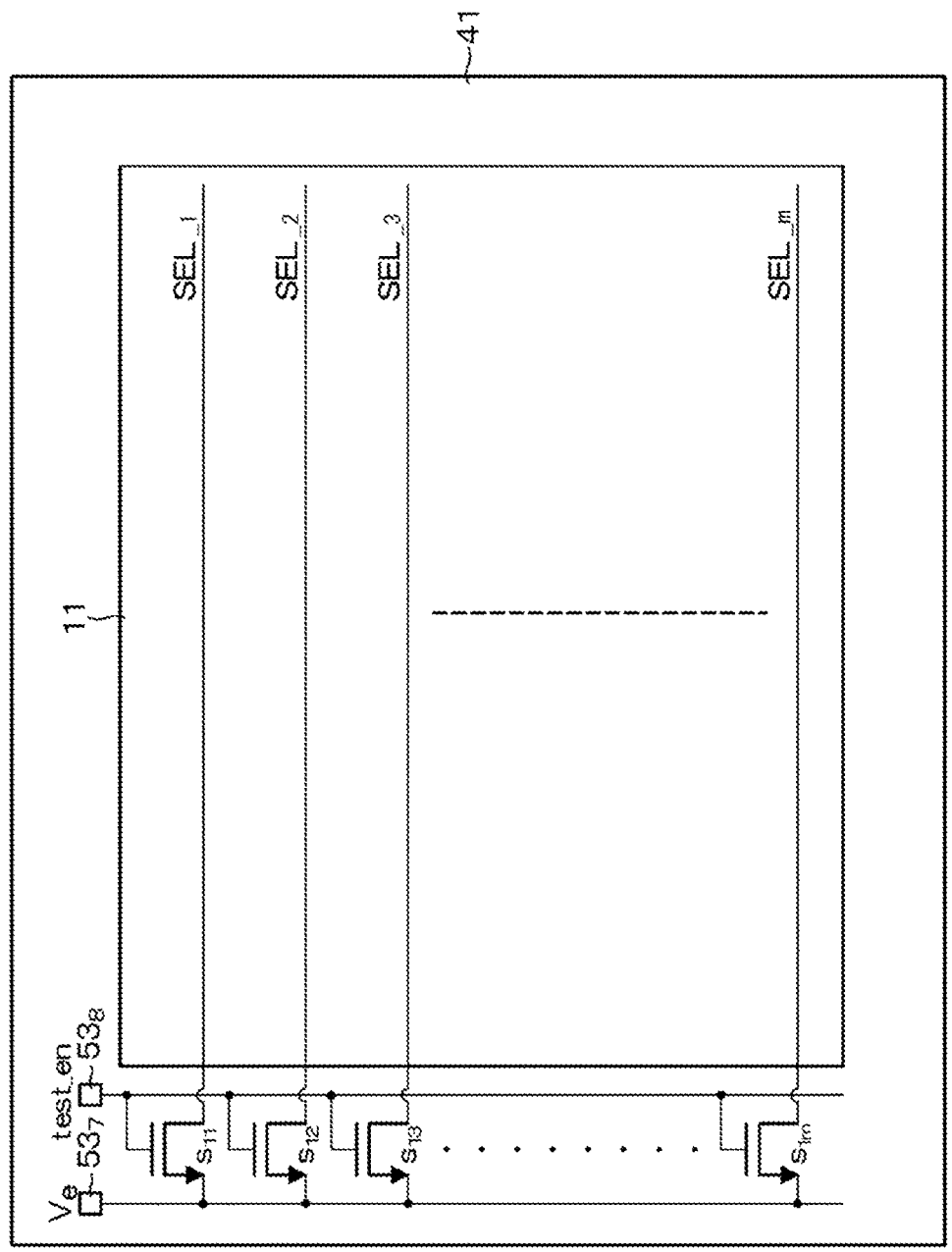
FIG. 13 is a diagram illustrating an example of a method for preventing erroneous detection of a break due to a leak current.

When an inspection for a break is performed on the vertical signal lines 32 ($32_1$ to $32_n$), a leak path can be formed between the vertical signal lines 32 and the node of the power supply voltage $V_{DD}$ via the selection transistor 25, and a leak current as indicated by the dotted arrow in FIG. 12 can flow. This can cause erroneous detection of a break. FIG. 13 shows an example of a method for preventing erroneous detection of a break due to this leak current.

Specifically, ends of wiring lines $SEL_{-1}$ to $SEL_{-m}$ that apply selection signals SEL to the selection transistors 25 of the pixels are connected to a test pad $53_7$ via switching transistors $s_{11}$ to $s_{1m}$. A voltage $V_e$ that is low enough to switch the selection transistors 25 to OFF state is applied to the test pad $53_7$ from the outside. Then, during inspection for a break, a high-level test signal test_en is given to the gate electrodes of the switching transistors $s_1$ to $s_{1m}$ via a test pad $53_8$.

As described above, when the high-level test signal test_en is given to the gate electrodes of the switching transistors $s_{11}$ to $S_{1m}$ during inspection for a break, the switching transistors $s_{11}$ to $s_{1m}$ are switched to ON state, so that a sufficiently low voltage $V_e$ is applied to the gate electrodes of the selection transistor 25 of the pixels via the wiring lines $SEL_{-1}$ to $SEL_{-m}$. As a result, the selection transistor 25 is in OFF state, and no leak current flows, so that it is possible to prevent erroneous detection of a break due to a leak current.

The pixel control lines $31_1$ to $31_m$ of the pixel array portion 11 are connected only to the gate electrodes of the pixel transistors (transfer transistor 22, reset transistor 23, and selection transistor 25), and thus the leak path as described above is not formed.

MODIFICATION

The technique according to the present disclosure has been described above based on the preferred embodiment, but the technique according to the present disclosure is not limited to the embodiment. The configuration and structure of the imaging device described in the above embodiment are examples, and can be changed as appropriate.

For example, in the above embodiment, the case in which the technique according to the present disclosure is applied to a CMOS image sensor that is composed of pixels 2 arranged in a matrix is described as an example, but the technique according to the present disclosure is not limited to the application to a CMOS image sensor. That is, the technique according to the present disclosure is applicable to any XY-addressable imaging devices in which pixels 2 are two-dimensionally arranged in a matrix.

APPLICATION EXAMPLE

Figure 14:
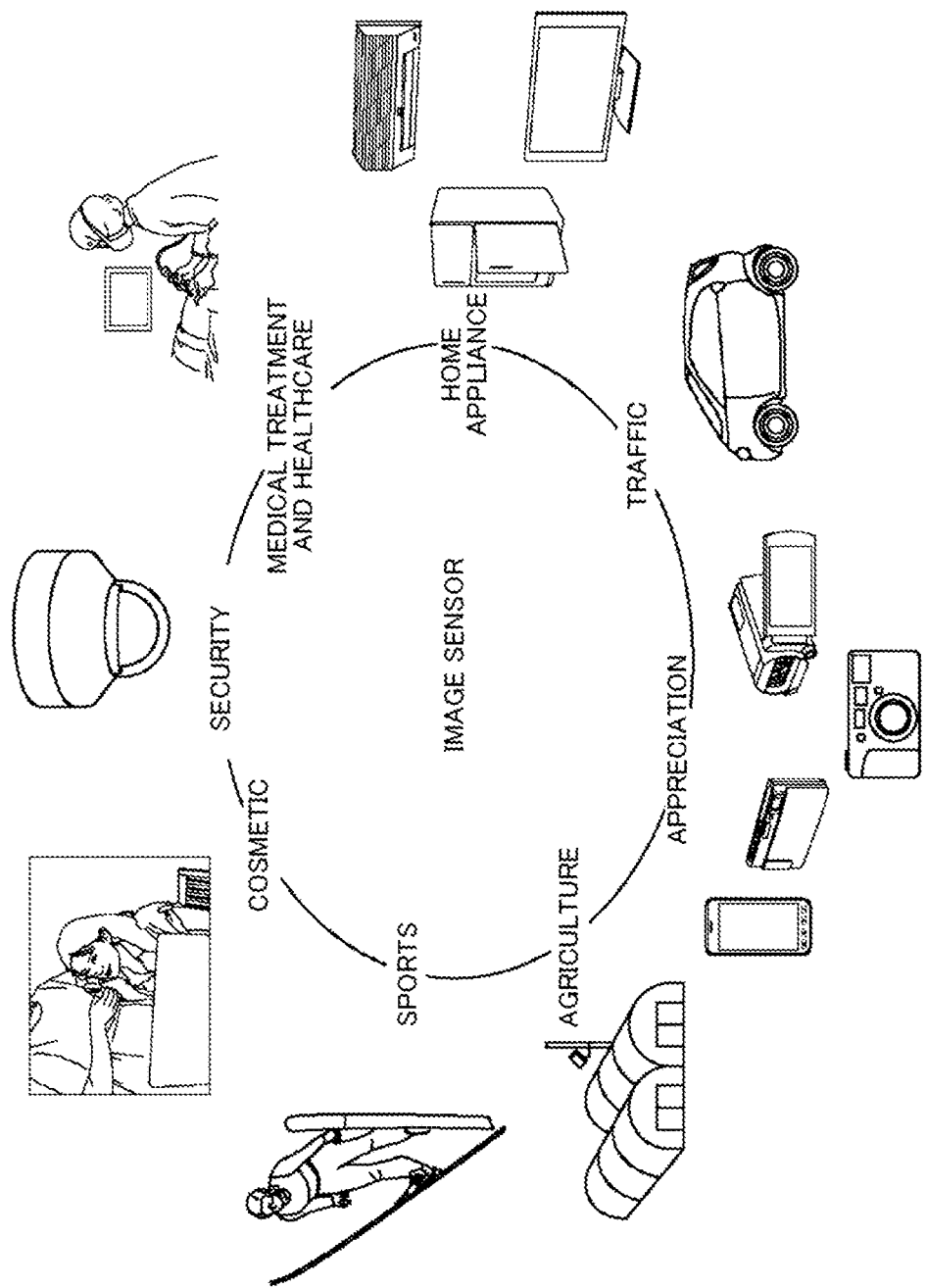
FIG. 14 is a diagram showing application examples of the technique according to the present disclosure.

The imaging device according to the present embodiment described above can be used for various devices that sense light such as visible light, infrared light, ultraviolet light, and X-ray, as shown in FIG. 14 for example. Specific examples of various devices are listed below.

- Devices that capture images fir appreciation, such as a digital camera and a mobile device with a camera function
- Devices for traffic, such as an in-vehicle sensor that captures images of the front, rear, surroundings, and inside of the vehicle for purposes including safe driving, such as automatic stopping, and determination of the condition of the driver, a monitoring camera for monitoring driving vehicles and roads, and a distance measurement sensor that measures the distances between vehicles and the like
- Devices used in home appliances, such as a TV a refrigerator, and an air conditioner, to capture images of user gestures and operate the devices according to the gestures
- Devices used for medical treatment and healthcare, such as an endoscope and a device that performs angiography by receiving infrared light
- Devices used for security, such as a surveillance camera for crime prevention and a camera for person authentication
- Devices used for cosmetic, such as a skin measuring instrument for capturing images of skin and a microscope for capturing images of scalp
- Devices used for sports, such as an action camera and a wearable camera for sports applications
- Devices used for agriculture, such as a camera for monitoring the condition of fields and crops Example of Application of the Technique According to the Present Disclosure The technique according to the present disclosure is applicable to various products. Specifically it is applicable to electronic equipment including imaging systems such as digital still cameras and video cameras, mobile terminal devices having imaging functions such as mobile phones, and copiers that use imaging elements in the image reading portion. An example in which the technique is applied to an imaging system such as a digital still camera or a video camera is now described.

Electronic Equipment of the Present Disclosure

Figure 15:
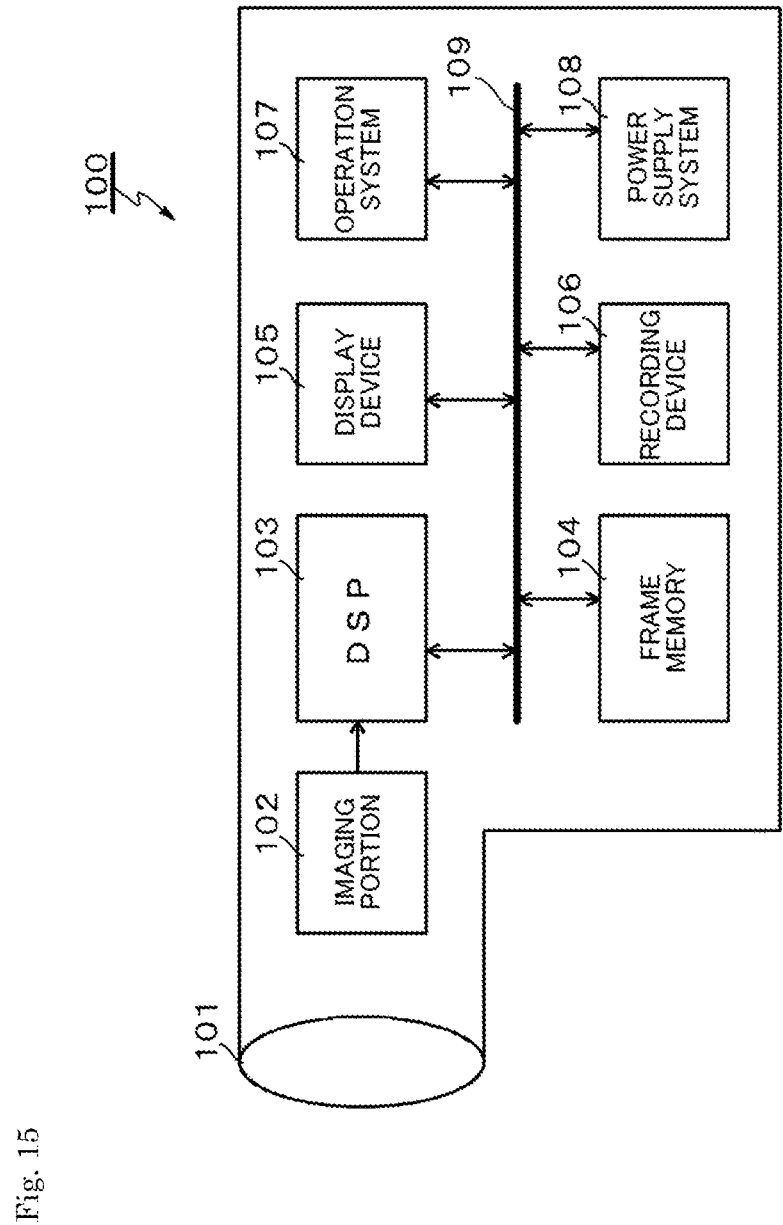
FIG. 15 is a block diagram schematically showing the configuration of an imaging system that is an example of the electronic equipment of the present disclosure.

FIG. 15 is a block diagram showing the configuration of an imaging system that is an example of electronic equipment of the present disclosure. As shown in FIG. 15, an imaging system 100 according to this example includes an imaging optical system 101 including a lens group and the like, an imaging portion 102, a digital signal processor (DSP) circuit 103, a frame memory 104, a display device 105, a recording device 106, an operation system 107, a power supply system 108, and the like. The DSP circuit 103, the frame memory 104, the display device 105, the recording device 106, the operation system 107, and the power supply system 108 are connected to one another via a bus line 109.

The imaging optical system 101 captures incident light (image light) from a subject and forms an image on the imaging surface of the imaging portion 102. The imaging portion 102 converts the amount of incident light imaged on the imaging surface by the optical system 101 into an electric signal for each pixel and outputs it as a pixel signal. The DSP circuit 103 performs general camera signal processing, such as white balance processing, demosaicing, and gamma correction processing.

The frame memory 104 is used for storing data in the process of signal processing in the DSP circuit 103 as required. The display device 105 is composed of a panel-type display device, such as a liquid crystal display device or an organic electroluminescence (EL) display device, and displays moving images or still images captured by the imaging portion 102. The recording device 106 records the moving images or still images captured by the imaging portion 102 on a recording medium, such as a portable semiconductor memory, an optical disk, or a hard disk drive (HDD).

The operation system 107 issues operation commands for various functions of the imaging system 100 under an operation of the user. The power supply system 108 supplies various power sources that serve as operation power sources for the DSP circuit 103, the frame memory 104, the display device 105, the recording device 106, and the operation system 107 to these supply targets as required.

In the imaging system 100 having the above configuration, the imaging device according to the above-described embodiment can be used as the imaging portion 102. As such, according to the imaging device, the wiring formed for each pixel row or each pixel column can be inspected with minimum additional circuits, so that an increase in the chip area is limited. Thus, by using the imaging device according to the above-described embodiment as the imaging portion 102, it is possible to limit an increase in size of the imaging system 100.

Application Example to Endoscopic Surgery System

The technique according to the present disclosure (present technique) is applicable, to various products. For example, the technique according to the present disclosure may be applied to endoscopic surgery systems.

Figure 16:
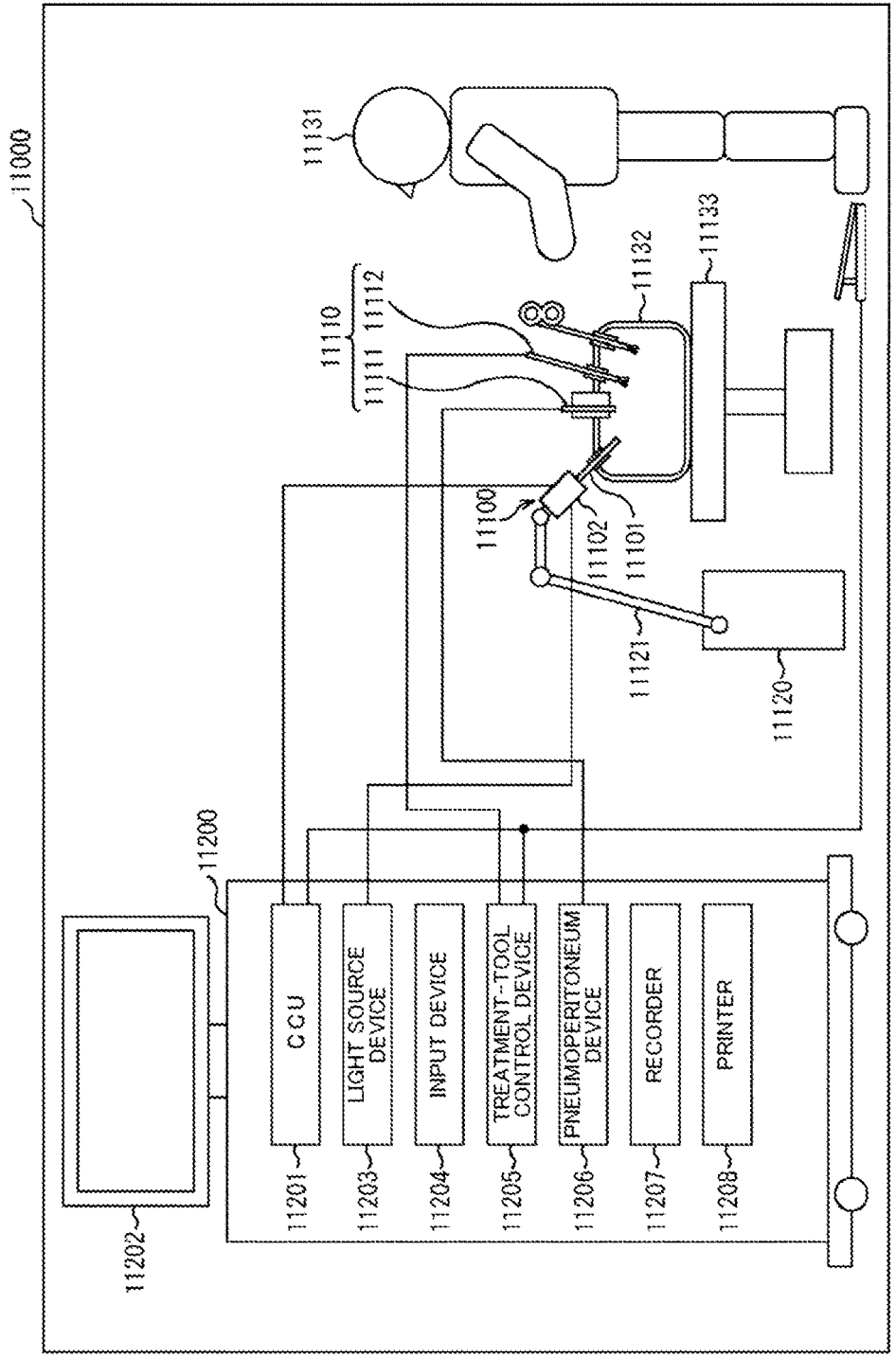
FIG. 16 is a diagram schematically showing the configuration of an endoscopic surgery system to which the technique according to the present disclosure is applicable.

FIG. 16 is a diagram schematically showing an example of the configuration of an endoscopic surgery system to which the technique according to the present disclosure (present technique) is applicable.

FIG. 16 illustrates a situation in which an operator (doctor) 11131 is performing surgery on a patient 11132 on a patient bed 11133 using an endoscopic surgery system 11000. As shown, the endoscopic surgery system 11000 is composed of an endoscope 11100, other surgical tools 11110, such as a pneumoperitoneum tube 11111 and an energy treatment tool 11112, a support arm device 11120 that supports the endoscope 11100, and a cart 11200 equipped with various devices for endoscopic surgery.

The endoscope 11100 is composed of a lens tube 11101, which has a region extending from its distal end over a predetermined length that is to be inserted in a body cavity of the patient 11132, and a camera head 11102 connected to the proximal end of the lens tube 11101. In the illustrated example, the endoscope 11100 configured as a so-called rigid endoscope having the rigid lens tube 11101 is illustrated, but the endoscope 11100 may be configured as a so-called flexible endoscope having a flexible lens tube.

An opening in which an objective lens is fitted is provided at the distal end of the lens tube 11101. A light source device 11203 is connected to the endoscope 11100, and the light generated by the light source device 11203 is guided to the distal end of the lens tube by a light guide, which extends inside the lens tube 11101, and applied toward the observation target in the body cavity of the patient 11132 through the objective lens. The endoscope 11100 may be a forward-viewing endoscope, a forward-oblique viewing endoscope, or a side-viewing endoscope.

An optical system and an imaging element are provided inside the camera head 11102, and the reflected light (observation light) from the observation target is focused on the imaging element by the optical system. The observation light is photoelectrically converted by the imaging element, and an electric signal corresponding to the observation light, that is, an image signal corresponding to the observation image is generated. The image signal is transmitted to a camera control unit (CCU) 11201 as RAW data.

The CCU 11201 may be composed of a central processing unit (CPU) or a graphic processing unit (CPU), for example, and comprehensively controls the operations of the endoscope 11100 and the display device 11202. Additionally, the CCU 11201 receives an image signal from the camera head 11102, and the image signal is subjected to various image processing for displaying an image based on the image signal, such as development processing (demosaicing).

Under the control of the CCU 11201, the display device 11202 displays an image based on the image signal on which the image processing is performed by the CCU 11201.

The light source device 11203 may be composed of a light source such as a light emitting diode (LED), and supplies illumination light to the endoscope 11100 when capturing an image of the surgical site and the like.

An input device 11204 is an input interface to the endoscopic surgery system 11000. The user can input various types of information and instructions to the endoscopic surgery system 11000 via the input device 11204. For example, the user inputs an instruction to change the photographing conditions (the type of illumination light, magnification, focal length, etc.) of the endoscope 11100.

A treatment-tool control device 11205 controls the driving of the energy treatment tool 11112 for tissue cauterization, incision, or sealing of blood vessels, for example. To expand a body cavity of the patient 11132 for the purpose of securing the field of view of the endoscope 11100 and the work space for the operator, a pneumoperitoneum device 11206 sends gas into the body cavity through the pneumoperitoneum tube 11111. A recorder 11207 is a device capable of recording various types of information relating to the surgery. A printer 11208 is a device capable of printing various types of information relating to the surgery in various formats such as text, images, and graphs.

The light source device 11203 that supplies illumination light to the endoscope 11100 when capturing an image of the surgical site is composed of, for example, an LED, a laser light source, or a white light source composed of a combination thereof. When a white light source is composed of a combination of RGB laser light sources, the output intensity and output timing of each color (each wavelength) can be controlled with high accuracy allowing the light source device 11203 to adjust the white balance of the captured image, in this case, the laser light from each of the RGB laser light sources may be applied to the observation target in a time-sharing manner, and the driving of the imaging element of the camera head 11102 may be controlled in synchronization with the application timing. This allows for the capturing of images corresponding to R, G, and B in a time-sharing manner. According to this method, a color image can be obtained without providing a color filter on the imaging element.

The driving of the light source device 11203 may be controlled so as to change the intensity of the output light at predetermined time intervals. By controlling the driving of the imaging element of the camera head 11102 in synchronization with the timing of changing the light intensity to obtain images in a time-sharing manner and by combining these images, high dynamic range images can be generated without so-called underexposure and overexposure.

Furthermore, the light source device 11203 may be configured to be able to supply light in a predetermined wavelength band that enables special light imaging. In special light imaging, so-called narrow-band imaging, for example, is performed that uses the wavelength dependency of the light absorption of body tissues and captures images of a predetermined tissue, such as a blood vessel in the mucous membrane surface layer with high contrast by applying light in a narrower band than the illumination light in normal imaging (that is, white light). Alternatively in special light imaging, fluorescence imaging may be performed in which an image is obtained using the fluorescence generated by applying excitation light. In fluorescence imaging, body tissue is irradiated with excitation light to observe the fluorescence from the body tissue (autofluorescence endoscopy), or a reagent such as indocyanine green (ICG) is locally injected into a body tissue, which is then irradiated with excitation light corresponding to the fluorescence wavelength of the reagent to obtain a fluorescence image. The light source device 11203 may be configured to be capable of supplying narrow-band light and/or excitation light for such special light imaging.

Figure 17:
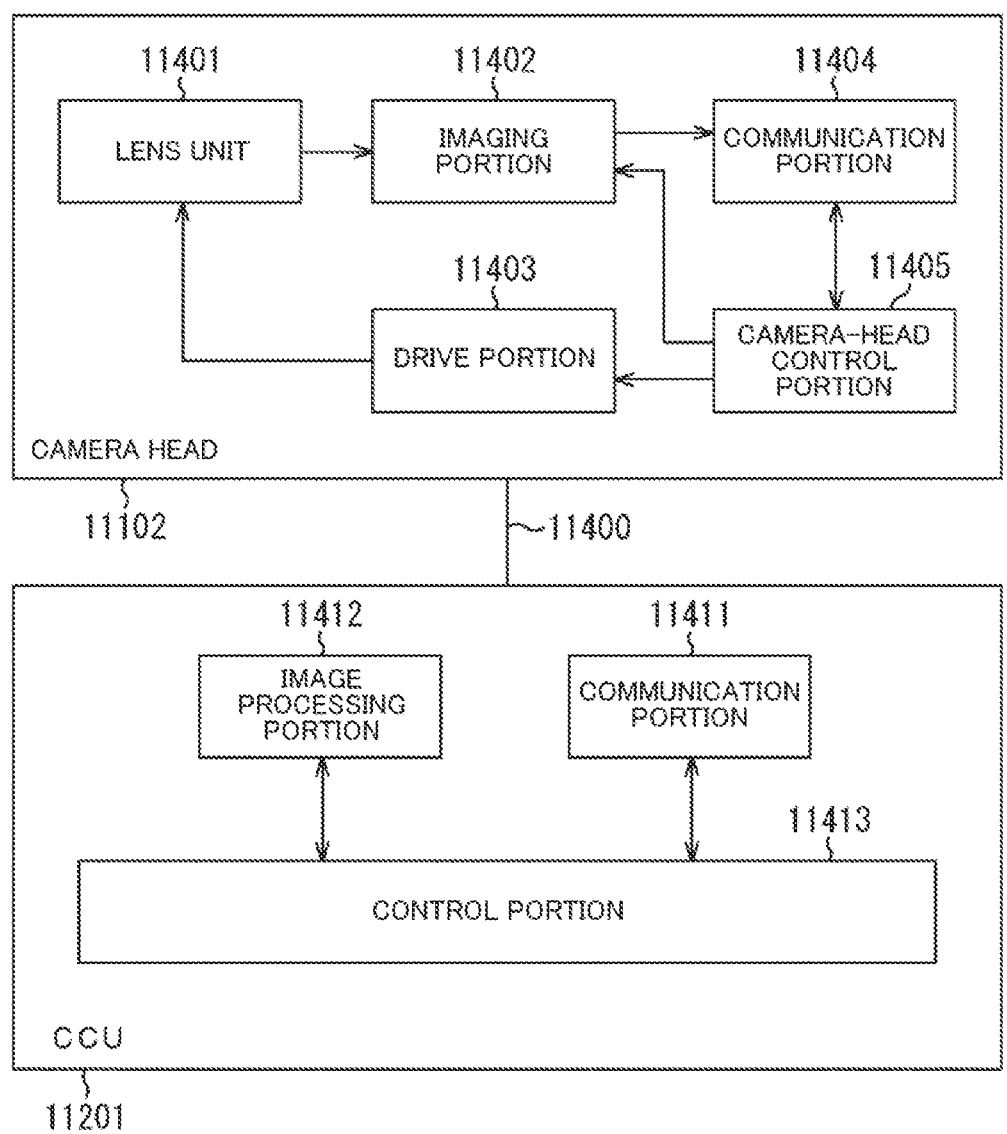
FIG. 17 is a block diagram showing an example of the functional configuration of a camera head and a CCU in the endoscopic surgery system.

FIG. 17 is a block diagram showing an example of the functional configuration of the camera head 11102 and the CCU 11201 shown in FIG. 16.

The camera head 11102 includes a lens unit 11401, an imaging portion 11402, a drive portion 11403, a communication portion 11404, and a camera-head control portion 11405. The CCU 11201 has a communication portion 11411, an image processing portion 11412, and a control portion 11413. The camera head 11102 and the CCU 11201 are connected by a transmission cable 11400 so as to communicate with each other.

The lens unit 11401 is an optical system provided at a connection portion with the lens tube 11101. The observation light taken in through the distal end of the lens tube 11101 is guided to the camera head 11102 and incident on the lens unit 11401. The lens unit 11401 is composed of a combination of a plurality of lenses including a zoom lens and a focus lens.

The imaging portion 11402 is composed of an imaging element. The imaging element composing the imaging portion 11402 may be one element (so-called single-chip type) or a plurality of elements (so-called multi-chip type). When the imaging portion 11402 is of a multi-chip type, each imaging element may generate an image signal corresponding to one of R, G, and B, and a color image may be obtained by combining these signals. Alternatively the imaging portion 11402 may be configured to have a pair of imaging elements each provided to obtain an image signal for one of the right eye and the left eye to achieve three-dimensional (3D) display. The 3D display enables the operator 11131 to more accurately identify the depth of the biological tissue in the surgical site. When the imaging portion 11402 is of a multi-chip type, a plurality of lens units 11401 may be provided corresponding to the imaging elements.

The imaging portion 11402 does not necessarily have to be provided in the camera head 11102. For example, the imaging portion 11402 may be provided inside the lens tube 11101 adjacent to and behind the objective lens.

The drive portion 11403 is composed of an actuator, and moves the zoom lens and the focus lens of the lens unit 11401 by a predetermined distance along the optical axis under the control of the camera-head control portion 11405. As a result, the magnification and focus of the image captured by the imaging portion 11402 can be adjusted as appropriate.

The communication portion 11404 is composed of a communication device for transmitting and receiving various types of information to and from the CCU 11201. The communication portion 11404 transmits the image signal obtained from the imaging portion 11402 as RAW data to the CCU 11201 via the transmission cable 11400.

The communication portion 11404 also receives a control signal for controlling the driving of the camera head 11102 from the CCU 11201 and feeds the control signal to the camera-head control portion 11405. The control signal contains information about the photographing conditions, such as information for specifying the frame rate of the captured image, information for specifying the exposure value for capturing images, and/or information for specifying the magnification and focus of the captured image.

The above-mentioned photographing conditions such as frame rate, exposure value, magnification, and focus may be specified by the user as required, or automatically set by the control portion 11413 of the CCU 11201 based on the obtained image signal. In the latter case, the endoscope 11100 has a so-called auto exposure (AE) function, an autofocus (AF) function, and an auto white balance (AWB) function.

The camera-head control portion 11405 controls the driving of the camera head 11102 based on the control signal from the CCU 11201 received via the communication portion 11404.

The communication portion 11411 is composed of a communication device for transmitting and receiving various types of information to and from the camera head 11102. The communication portion 11411 receives an image signal transmitted from the camera head 11102 via the transmission cable 11400.

The communication portion 11411 also transmits a control signal for controlling the driving of the camera head 11102 to the camera head 11102. Image signals and control signals can be transmitted by telecommunications, optical communication, or the like.

The image processing portion 11412 performs various types of image processing on the image signal, which is the RAW data transmitted from the camera head 11102.

The control portion 11413 performs various controls relating to the capturing of images of the surgical site and the like by the endoscope 11100 and the display of the images obtained by capturing images of the surgical site and the like. For example, the control portion 11413 generates a control signal for controlling the driving of the camera head 11102.

The control portion 11413 also causes the display device 11202 to display the captured image of the surgical site and the like, based on the image signal on which the image processing is performed by the image processing portion 11412. At this time, the control portion 11413 may identify various objects in the captured image using various image recognition techniques. For example, by detecting the shape of the edge and color of an object in the captured image, the control portion 11413 can identify a surgical tool such as forceps, a specific biological site, bleeding, and mist in the use of the energy treatment tool 11112, for example. When displaying the captured image on the display device 11202, the control portion 11413 may superimpose various types of information that aids the surgery on the image of the surgical site, using the result of identification. By providing the operator 11131 with the superimposed information that aids the surgery the burden on the operator 11131 can be reduced, and the operator 11131 can reliably perform the surgery.

The transmission cable 11400 connecting the camera head 11102 and the CCU 11201 may be an electric signal cable that enables electric signal communication, an optical fiber that enables optical communication, or a composite cable of these.

In the illustrated example, the communication is performed by wire using the transmission cable 11400, but the communication between the camera head 11102 and the CCU 11201 may be performed wirelessly.

The above is an example of an endoscopic surgery system to which the technique according to the present disclosure is applicable. The technique according to the present disclosure is applicable to the imaging portion 11402 of the camera head 11102 in the configuration described above. By applying the technique according to the present disclosure to the imaging portion 11402 of the camera head 11102, the wiring formed for each pixel row or each pixel column can be inspected with minimum additional circuits, so that an increase in the chip area is limited. As a result, it is possible to limit an increase in size of the imaging portion 11402 of the camera head 11102 since an increase in the chip area is limited.

Application Example to Moving Object

The technique according to the present disclosure (present technique) is applicable, to various products in addition to endoscopic surgery systems. For example, the technique according to the present disclosure may be embodied as an imaging element that is mounted on a moving object of any types, such as vehicles, electric vehicles, hybrid electric vehicles, motorcycles, bicycles, personal mobility devices, airplanes, drones, ships, robots, construction machines, and agricultural machines (tractors).

Figure 18:
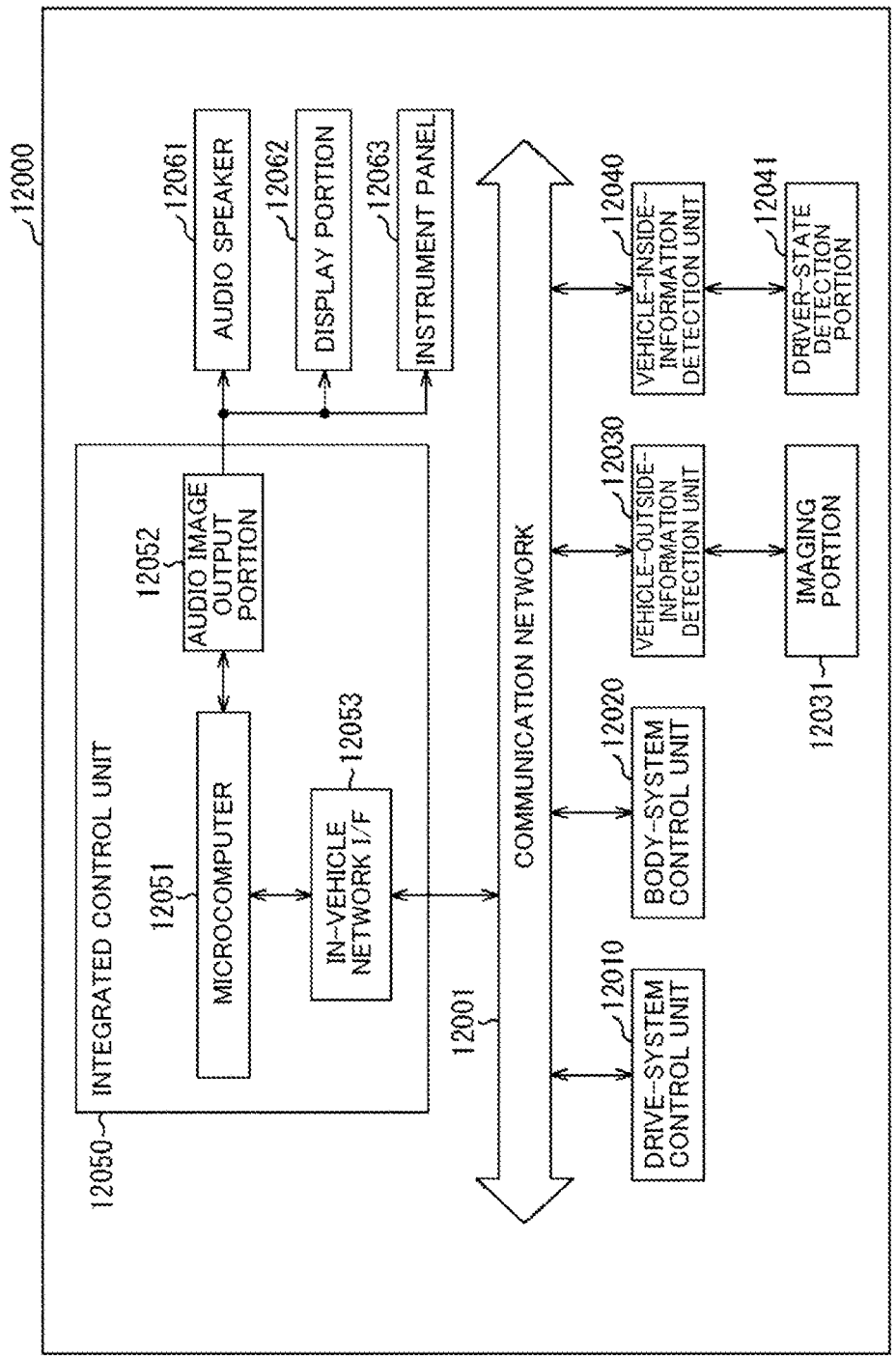
FIG. 18 is a block diagram schematically showing an example of the configuration of a vehicle control system that is an example of a moving-object control system to which the technique according to the present disclosure is applicable.

FIG. 18 is a block diagram schematically showing an example of the configuration of a vehicle control system, which is an example of a moving-object control system to which the technique according to the present disclosure is applicable.

A vehicle control system 12000 includes a plurality of electronic control units connected via a communication network 12001. In the example shown in FIG. 1021, the vehicle control system 12000 includes a drive-system control unit 12010, a body-system control unit 12020, a vehicle-outside-information detection unit 12030, a vehicle-inside-information detection unit 12040, and an integrated control unit 12050. Additionally as functional configurations of the integrated control unit 12050, a microcomputer 12051, an audio image output portion 12052, and an in-vehicle network interface (I/F) 12053 are shown.

The drive-system control unit 12010 controls the operation of the devices related to the drive system of the vehicle according to various programs. For example, the drive-system control unit 12010 functions as a controller for a driving-force generator for generating driving force of the vehicle, such as an internal combustion engine or a driving motor, a driving-force transmission mechanism for transmitting the driving force to the wheels, a steering mechanism for adjusting the steering angle of the vehicle, a braking device for generating braking force of the vehicle, and the like.

The body-system control unit 12020 controls the operation of various devices mounted on the vehicle body according to various programs. For example, the body-system control unit 12020 functions as a controller for a keyless entry system, a smart key system, a power window device, and various lights such as headlights, back-up lights, brake lights, blinkers, and fog lights. In this case, the radio waves transmitted from a portable device that substitutes for the key, or signals of various switches may be input to the body-system control unit 12020. The body-system control unit 12020 receives inputs of these radio waves or signals and controls a door lock device, the power window device, lights, and the like of the vehicle.

The vehicle-outside-information detection unit 12030 detects information on the outside of the vehicle equipped with the vehicle control system 12000. For example, the imaging portion 12031 is connected to the vehicle-outside-information detection unit 12030. The vehicle-outside-information detection unit 12030 causes the imaging portion 12031 to capture an image of the outside of the vehicle and receives the captured image. Based on the received image, the vehicle-outside-information detection unit 12030 may perform detection processing or distance detection processing with respect to objects such as a person, a vehicle, an obstacle, a sign, or characters on the road surface.

The imaging portion 12031 is an optical sensor that receives light and outputs an electric signal according to the amount of the light received. The imaging portion 12031 can output an electric signal as an image or as distance measurement information. The light received by the imaging portion 12031 may be visible light or invisible light such as infrared rays.

The vehicle-inside-information detection unit 12040 detects information on the inside of the vehicle. For example, a driver-state detection portion 12041, which detects the driver's state, is connected to the vehicle-inside-information detection unit 12040. The driver-state detection portion 12041 includes, for example, a camera that captures an image of the driver, and the vehicle-inside-information detection unit 12040 may determine the degree of fatigue or concentration of the driver, or determine whether the driver is dozing, based on the detection information input from the driver-state detection portion 12041.

Based on the information on the inside and outside the vehicle obtained by the vehicle-outside-information detection unit 12030 or the vehicle-inside-information detection unit 12040, the microcomputer 12051 can calculate the control target values of the driving-force generator, the steering mechanism, or the braking device and output a control command to the drive-system control unit 12010. For example, the microcomputer 12051 can perform cooperative control for the purpose of achieving an advanced driver assistance system (ADAS) function including vehicle collision avoidance and impact relief, driving with headway control based on the vehicle-to-vehicle distance, constant speed driving, vehicle collision warning, vehicle lane deviation warning, and the like.

Based on the information on the surroundings of the vehicle obtained by the vehicle-outside-information detection unit 12030 or the vehicle-inside-information detection unit 12040, the microcomputer 12051 can control the driving-force generator, the steering mechanism, the braking device, and the like to perform a cooperative control for the purpose of automated driving or the like, in which the vehicle travels autonomously without depending on the maneuvering by the driver.

The microcomputer 12051 can also output a control command to the body-system control unit 12020 based on the information on the outside of the vehicle obtained by the vehicle-outside-information detection unit 12030. For example, the microcomputer 12051 controls the headlights according to the position of the preceding vehicle or an oncoming vehicle detected by the vehicle-outside-information detection unit 12030, and performs cooperative control for the purpose of antiglare, such as switching the high beam to the low beam.

The audio image output portion 12052 transmits an output signal of at least one of audio and an image to an output device capable of visually or audibly issuing information to the passenger or to the outside of the vehicle. In the example of FIG. 18, an audio speaker 12061, a display portion 12062, and an instrument panel 12063 are illustrated as examples of output devices. The display portion 12062 may include, for example, at least one of an onboard display and a head up display.

Figure 19:
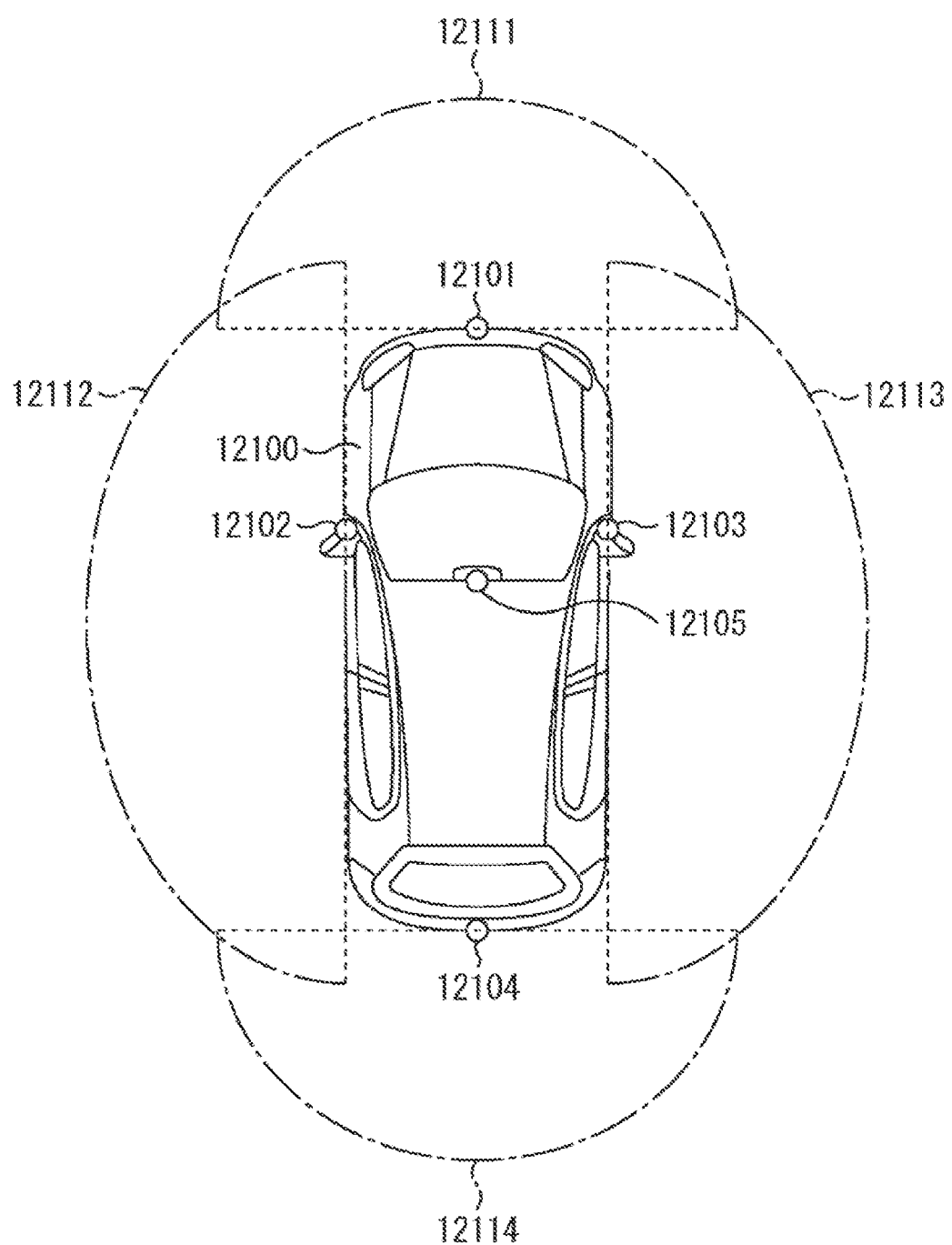
FIG. 19 is a diagram showing an example of installation positions of the imaging portion in the moving-object control system.

FIG. 19 is a diagram showing an example of installation positions of the imaging portion 12031.

In FIG. 19, the vehicle 12100 has imaging portions 12101, 12102, 12103, 12104, and 12105 as the imaging portion 12031.

The imaging portions 12101, 12102, 12103, 12104, and 12105 are provided at positions such as the front nose, side mirrors, rear bumper, back door, and the upper part of the windshield in the passenger compartment of the vehicle 12100. The imaging portion 12101 provided in the front nose and the imaging portion 12105 provided in the upper part of the windshield in the passenger compartment mainly obtain images of the front side of the vehicle 12100. The imaging portions 12102 and 12103 provided in the side mirrors mainly obtain images of the sides of the vehicle 12100. The imaging portion 12104 provided in the rear bumper or the back door mainly obtains images of the rear of the vehicle 12100. The images of the front side obtained by the imaging portions 12101 and 12105 are mainly used to detect the preceding vehicle, a pedestrian, an obstacle, a traffic light, a traffic sign, a lane, or the like.

FIG. 19 shows an example of the image ranges of the imaging portions 12101 to 12104. The image range 12111 indicates the image range of the imaging portion 12101 provided in the front nose, the image ranges 12112 and 12113 indicate the image ranges of the imaging portions 12102 and 12103, respectively provided in the side mirrors, and the image range 12114 indicates the image range of the imaging portion 12104 provided in the rear bumper or the back door. For example, by superimposing the image data captured by the imaging portions 12101 to 12104, a bird's-eye view image of the vehicle 12100 as viewed from above can be obtained.

At least one of the imaging portions 12101 to 12104 may have a function of obtaining distance information. For example, at least one of the imaging portions 12101 to 12104 may be a stereo camera composed of a plurality of imaging elements, or may be an imaging element having pixels for phase difference detection.

For example, based on the distance information obtained from the imaging portions 12101 to 12104, the microcomputer 12051 determines the distances to three-dimensional objects located within the image ranges 12111 to 12114, and the temporal changes in these distances (the speed relative to the vehicle 12100). This allows for the extraction, as the preceding vehicle, of the closest three-dimensional object on the traveling path of the vehicle 12100 that travels at a predetermined speed (for example, 0 km/h or more) in substantially the same direction as the vehicle 12100. Furthermore, the microcomputer 12051 can preset the vehicle-to-vehicle distance to be maintained to the preceding vehicle, and can perform automatic braking control (including stop control in driving with headway control), automatic acceleration control (including start control in driving with headway control), and the like. In this manner, it is possible to perform cooperative control for the purpose of automated driving or the like, in which the vehicle travels autonomously without depending on the maneuvering by the driver.

For example, based on the distance information obtained from the imaging portions 12101 to 12104, the microcomputer 12051 can extract and classify three-dimensional object data on three-dimensional objects into motorcycle, standard-sized vehicle, large vehicle, pedestrian, electric pole, and other three-dimensional object, and use it for automatic obstacle avoidance. For example, the microcomputer 12051 classifies obstacles around the vehicle 12100 into obstacles that can be visually recognized by the driver of the vehicle 12100, and obstacles that are difficult to visually recognize. The microcomputer 12051 determines the collision risk, which indicates the risk of collision with each obstacle. When the collision risk is equal to or higher than the set value and therefore there is a possibility of collision, the microcomputer 12051 outputs an alert to the driver via the audio speaker 12061 or the display portion 12062, or performs forced deceleration and avoidance steering via the drive-system control unit 12010 to provide driving support for collision avoidance.

At least one of the imaging portions 12101 to 12104 may be an infrared camera that detects infrared rays. For example, the microcomputer 12051 can recognize a pedestrian by determining whether a pedestrian is present in the images captured by the imaging portions 12101 to 12104. Such pedestrian recognition includes, for example, a step of extracting feature points in the images captured by the imaging portions 12101 to 12104, which serve as infrared cameras, and a step of determining whether an object is a pedestrian by performing pattern matching processing on a series of feature points indicating the contours of the object. When the microcomputer 12051 determines that a pedestrian is present in the images captured by the imaging portions 12101 to 12104 and recognizes the pedestrian, the audio image output portion 12052 controls the display portion 12062 to display a rectangular contour line superimposed on the recognized pedestrian for highlighting. Furthermore, the audio image output portion 12052 may control the display portion 12062 so as to display at a desired position, an icon or the like indicating the pedestrian.

The example of the vehicle control system to which the technique according to the present disclosure is applicable is described above. The technique according to the present disclosure is applicable to, for example, the imaging portion 12031 in the configuration described above. By applying the technique according to the present disclosure to the imaging portion 12031 or the like, the wiring formed for each pixel row or each pixel column can be inspected with minimum additional circuits, so that an increase in the chip area is limited. As a result, it is possible to limit an increase in size of the imaging portion 12031 since an increase in the chip area is limited.

Configuration in Which the Present Disclosure can be Embodied

The present disclosure may be embodied in the following configurations.

A. Imaging Device

[A-1.] An imaging device comprising:
 a first substrate in which a pixel array portion composed of pixels that include light receiving portions and are arranged in a matrix is formed; and
 a second substrate in which a pixel control portion that controls the pixels is formed and on which the first substrate is stacked, wherein
 the first substrate includes
 a first wiring line configured to transmit a first voltage,
 a second wiring line configured to transmit a second voltage, and
 a fault detection circuit configured to, when the pixel array portion is divided into a plurality of pixel blocks each corresponding to a plurality of pixel columns or a plurality of pixel rows, perform detection of a wiring fault for each pixel block, and the fault detection circuit is configured to
 during time for detecting a wiring fault, connect a plurality of wiring lines corresponding to a plurality of pixel columns or a plurality of pixel rows in series in each pixel block, connect one of ends of a wiring chain connected in series in each pixel block to the first wiring line, connect the other end to the second wiring line, and
 detect a wiring fault based on a potential at an intermediate position of the wiring chain.

[A-2] The imaging device according to [A-1], wherein
 the fault detection circuit includes a switching element group that is configured to, during the time for detecting a wiring fault, form a wiring chain by connecting a plurality of wiring lines in series in each pixel block between the first wiring line and the second wiring line,
 a switching element at one of ends of the switching element group is connected to the first wiring line, and a switching element at the other end is connected to the second wiring line.

[A-3] The imaging device according to [A-1] or [A-2], wherein
 the first substrate includes
 a third wiring line configured to transmit a third voltage, and
 a fourth wiring line configured to transmit a fourth voltage, and
 the fault detection circuit includes
 a first switching element that is connected to an intermediate position of the wiring chain and reads out a potential at the intermediate position, and
 a second switching element that is connected between the third wiring line and the fourth wiring line and performs an on/off operation according to the potential at the intermediate position read out through the first switching element.

[A-4] The imaging device according to [A-3], wherein the fault detection circuit is configured to detect a wiring fault depending on whether a short current is generated between the third wiring line and the fourth wiring line.

[A-5] The imaging device according to [A-4], wherein the fault detection circuit is configured to detect a wiring break fault between one of the ends of the wiring chain and an intermediate position of the wiring chain, or a wiring break fault between the intermediate position of the wiring chain and the other end of the wiring chain.

[A-6] The imaging device according to [A-3], wherein the switching elements of the switching element group, the first switching element, and the second switching element of the fault detection circuit are composed of conductive type transistors that are identical to transistors composing the pixels.

[A-7] The imaging device according to [A-6], wherein
when the transistors composing the pixels are composed of N-channel MOS transistors,
the switching elements of the switching element group, the first switching element, and the second switching element of the fault detection circuit are composed of N-channel MOS transistors of a same type as the pixels.

B. Electronic Equipment

[B-1] Electronic equipment comprising an imaging device that includes:
a first substrate in which a pixel array portion composed of pixels that include light receiving portions and are arranged in a matrix is formed; and
a second substrate in which a pixel control portion that controls the pixels is formed and on which the first substrate is stacked, wherein
the first substrate includes
a first wiring line configured to transmit a first voltage,
a second wiring line configured to transmit a second voltage, and
a fault detection circuit configured to, when the pixel array portion is divided into a plurality of pixel blocks each corresponding to a plurality of pixel columns or a plurality of pixel rows, perform detection of a wiring fault for each pixel block, and
the fault detection circuit is configured to
during time for detecting a wiring fault, connect a plurality of wiring lines corresponding to a plurality of pixel columns or a plurality of pixel rows in series in each pixel block, connect one of ends of a wiring chain connected in series in each pixel block to the first wiring line, connect the other end to the second wiring line, and
detect a wiring fault based on a potential at an intermediate position of the wiring chain.

[B-2] The electronic equipment according to [B-1], wherein
the fault detection circuit includes a switching element group that is configured to, during the time for detecting a wiring fault, form a wiring chain by connecting a plurality of wiring lines in series in each pixel block between the first wiring line and the second wiring line,
a switching element at one of ends of the switching element group is connected to the first wiring line, and a switching element at the other end is connected to the second wiring line.

[B-3] The electronic equipment according to [B-1] or [B-2], wherein
the first substrate includes
a third wiring line configured to transmit a third voltage, and
a fourth wiring line configured to transmit a fourth voltage, and
the fault detection circuit includes
a first switching element that is connected to an intermediate position of the wiring chain and reads out a potential at the intermediate position, and
a second switching element that is connected between the third wiring line and the fourth wiring line and performs an on/off operation according to the potential at the intermediate position read out through the first switching element.

[B-4] The electronic equipment according to [B-3], wherein the fault detection circuit is configured to detect a wiring fault, depending on whether a short current is generated between the third wiring line and the fourth wiring line.

[B-5] The electronic equipment according to [B-4], wherein the fault detection circuit is configured to detect a wiring break fault between one of the ends of the wiring chain and an intermediate position of the wiring chain, or a wiring break fault between the intermediate position of the wiring chain and the other end of the wiring chain.

[B-6] The electronic equipment according to [B-3], wherein the switching elements of the switching element group, the first switching element, and the second switching element of the fault detection circuit are composed of conductive type transistors that are identical to transistors composing the pixels.

[B-7] The electronic equipment according to [B-6], wherein
when the transistors composing the pixels are composed of N-channel MOS transistors,
the switching elements of the switching element group, the first switching element, and the second switching element of the fault detection circuit are composed of N-channel MOS transistors of a same type as the pixels.

REFERENCE SIGNS LIST

1 CMOS image sensor
2 Pixels
11 Pixel array portion
12 Row selection portion
13 Constant, current source portion
14 Analog-to-digital conversion portion
15 Horizontal transfer scanning portion
16 Signal processing portion
17 Timing control portion
18 Horizontal transfer line
19 Reference signal generation portion
21 Photodiode (light receiving portion)
22 Transfer transistor
28 Reset transistor
24 Amplification transistor
25 Selection transistor
31 ($31_1$ to $31_m$) Pixel control line
32 ($32_1$ to $32_n$) Vertical signal line
41 Pixel chip (first substrate)
42 Logic chip (second substrate)
43 (43A, 43B), 44 (44A, 44B) Connection portion
47A to 47D Fault detection circuit
48A to 48D Pad portion
$51_1$ to $51_P$ Pixel block
$52_1$ to $52_6$ Connection wiring line
$53_1$ to $53_8$ Test pad

The invention claimed is:

1. An imaging device comprising:
a first substrate in which a pixel array portion composed of pixels that include light receiving portions and are arranged in a matrix is formed; and
a second substrate in which a pixel control portion that controls the pixels is formed and on which the first substrate is stacked, wherein
the first substrate includes
a first wiring line configured to transmit a first voltage,
a second wiring line configured to transmit a second voltage, and
a fault detection circuit configured to, when the pixel array portion is divided into a plurality of pixel blocks each corresponding to a plurality of pixel columns or a plurality of pixel rows, perform detection of a wiring fault for each pixel block, and
the fault detection circuit is configured to,
during time for detecting a wiring fault, connect a plurality of wiring lines corresponding to a plurality of pixel columns or a plurality of pixel rows in series in each pixel block, connect one of ends of a wiring chain connected in series in each pixel block to the first wiring line, connect the other end to the second wiring line, and
detect a wiring fault based on a potential at an intermediate position of the wiring chain.

2. The imaging device according to claim 1, wherein the fault detection circuit includes a switching element group that is configured to, during the time for detecting a wiring fault, form a wiring chain by connecting a plurality of wiring lines in series in each pixel block between the first wiring line and the second wiring line,
a switching element at one of ends of the switching element group is connected to the first wiring line, and a switching element at the other end is connected to the second wiring line.

3. The imaging device according to claim 1, wherein the first substrate includes
a third wiring line configured to transmit a third voltage, and
a fourth wiring line configured to transmit a fourth voltage, and
the fault detection circuit includes
a first switching element that is connected to an intermediate position of the wiring chain and reads out a potential at the intermediate position, and
a second switching element that is connected between the third wiring line and the fourth wiring line and performs an on/off operation according to the potential at the intermediate position read out through the first switching element.

4. The imaging device according to claim 3, wherein the fault detection circuit is configured to detect a wiring fault depending on whether a short current is generated between the third wiring line and the fourth wiring line.

5. The imaging device according to claim 4, wherein the fault detection circuit is configured to detect a wiring break fault between one of the ends of the wiring chain and an intermediate position of the wiring chain, or a wiring break fault between the intermediate position of the wiring chain and the other end of the wiring chain.

6. The imaging device according to claim 3, wherein the switching elements of the switching element group, the first switching element, and the second switching element of the fault detection circuit are composed of transistors of a conductive type that is identical to that of transistors composing the pixels.

7. The imaging device according to claim 6, wherein
when the transistors composing the pixels are composed of N-channel MOS transistors,
the switching elements of the switching element group, the first switching element, and the second switching element of the fault detection circuit are composed of N-channel MOS transistors of a same type as the pixels.

8. An electronic apparatus comprising an imaging device that includes:
a first substrate in which a pixel array portion composed of pixels that include light receiving portions and are arranged in a matrix is formed; and
a second substrate in which a pixel control portion that controls the pixels is formed and on which the first substrate is stacked, wherein
the first substrate includes
a first wiring line configured to transmit a first voltage,
a second wiring line configured to transmit a second voltage, and
a fault detection circuit configured to, when the pixel array portion is divided into a plurality of pixel blocks each corresponding to a plurality of pixel columns or a plurality of pixel rows, perform detection of a wiring fault for each pixel block, and
the fault detection circuit is configured to
during time for detecting a wiring fault, connect a plurality of wiring lines corresponding to a plurality of pixel columns or a plurality of pixel rows in series in each pixel block, connect one of ends of a wiring chain connected in series in each pixel block to the first, wiring line, connect the other end to the second wiring line, and
detect a wiring fault based on a potential at an intermediate position of the wiring chain.

* * * * *